United States Patent
Murakami et al.

(10) Patent No.: US 11,329,079 B2
(45) Date of Patent: *May 10, 2022

(54) IMAGING DEVICE INCLUDING PHOTOELECTRIC CONVERTER AND CIRCUITRY INCLUDING A FIRST CAPACITANCE ELEMENT, A SECOND CAPACITANCE ELEMENT AND A TRANSISTOR

(71) Applicant: Panasonic Intellectual Property Management Co., Ltd., Osaka (JP)

(72) Inventors: Masashi Murakami, Kyoto (JP); Kazuko Nishimura, Kyoto (JP); Yutaka Abe, Osaka (JP); Yoshiyuki Matsunaga, Kyoto (JP); Yoshihiro Sato, Osaka (JP); Junji Hirase, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/945,636

(22) Filed: Jul. 31, 2020

(65) Prior Publication Data

US 2020/0365633 A1    Nov. 19, 2020

Related U.S. Application Data

(63) Continuation of application No. 16/401,974, filed on May 2, 2019, now Pat. No. 10,770,491, which is a
(Continued)

(30) Foreign Application Priority Data

Dec. 26, 2014   (JP) .................. 2014-264694
Dec. 26, 2014   (JP) .................. 2014-264695
(Continued)

(51) Int. Cl.
*H01L 27/146*   (2006.01)
*H01L 51/42*    (2006.01)

(52) U.S. Cl.
CPC .. *H01L 27/14609* (2013.01); *H01L 27/14632* (2013.01); *H01L 27/14643* (2013.01);
(Continued)

(58) Field of Classification Search
CPC ......... H01L 27/14636; H01L 27/14665; H01L 27/14609; H01L 27/14612; H01L 51/42; H04N 5/374; H04N 5/378
(Continued)

(56) References Cited

U.S. PATENT DOCUMENTS 7,075,049 B2   7/2006   Rhodes et al.
9,571,768 B2   2/2017   Tashiro et al.
(Continued)

FOREIGN PATENT DOCUMENTS

JP   2001-177084 A   6/2001
JP   2003-051986     2/2003
(Continued)

OTHER PUBLICATIONS

Non-final Office Action issued in U.S. Appl. No. 15/878,902, dated Oct. 31, 2018.
(Continued)

*Primary Examiner* — Que Tan Le
(74) *Attorney, Agent, or Firm* — McDermott Will & Emery LLP

(57) ABSTRACT

An imaging device including a semiconductor substrate; a photoelectric converter stacked on the semiconductor sub-
(Continued)

strate, the photoelectric converter being configured to generate a signal through photoelectric conversion of incident light; a multilayer wiring structure located between the semiconductor substrate and the photoelectric converter; and circuitry located in the multilayer wiring structure and the semiconductor substrate, the circuitry being configured to detect the signal. The circuitry includes a first capacitance element and a second capacitance element; and a first transistor including a first source and a first drain in the semiconductor substrate and a first gate. The first capacitance element includes a first electrode, a second electrode, and a dielectric film between the first electrode and the second electrode, the multilayer wiring structure includes an insulating layer adjacent to the first capacitance element, and a permittivity of the dielectric film is greater than a permittivity of the insulating layer.

8 Claims, 22 Drawing Sheets

Related U.S. Application Data continuation of application No. 15/878,902, filed on Jan. 24, 2018, now Pat. No. 10,325,945, which is a continuation of application No. 14/972,153, filed on Dec. 17, 2015, now Pat. No. 9,917,119.

(30) Foreign Application Priority Data

Aug. 27, 2015 (JP) .................................. 2015-167556
Oct. 21, 2015 (JP) .................................. 2015-207381

(52) U.S. Cl.
CPC .. *H01L 27/14665* (2013.01); *H01L 27/14636* (2013.01); *H01L 51/42* (2013.01)

(58) Field of Classification Search
USPC .......................................... 250/208.1, 214 R
See application file for complete search history.

(56) References Cited

U.S. PATENT DOCUMENTS

| | | | |
|---|---|---|---|
| 10,446,594 | B2 | 10/2019 | Tashiro et al. |
| 10,490,591 | B2 * | 11/2019 | Tomekawa ............. H04N 5/363 |
| 10,497,739 | B2 * | 12/2019 | Takase .................... H01L 28/60 |
| 2003/0034434 | A1 | 2/2003 | Simony |
| 2005/0040320 | A1 | 2/2005 | Lule et al. |
| 2009/0179293 | A1 | 7/2009 | Shim et al. |
| 2009/0303358 | A1 | 12/2009 | Kawahito |
| 2011/0240868 | A1 | 10/2011 | Ruetten et al. |
| 2014/0063328 | A1 | 3/2014 | Ichimiya |
| 2014/0346321 | A1 | 11/2014 | Kinugasa |
| 2015/0146061 | A1 | 5/2015 | Ishii |
| 2016/0191825 | A1 | 6/2016 | Sato et al. |

FOREIGN PATENT DOCUMENTS

| | | |
|---|---|---|
| JP | 2007-027601 A | 2/2007 |
| JP | 2008-305983 | 12/2008 |
| JP | 2009-164604 A | 7/2009 |
| JP | 2009-165186 A | 7/2009 |
| JP | 2011-071481 A | 4/2011 |
| JP | 2011-091724 A | 5/2011 |
| JP | 2011-228621 A | 11/2011 |
| JP | 2012-510198 A | 4/2012 |
| JP | 2013-030820 A | 2/2013 |
| JP | 2013-192058 A | 9/2013 |
| JP | 2014-053694 | 3/2014 |
| JP | 2014-230212 A | 12/2014 |
| WO | 2008/016049 A1 | 2/2008 |
| WO | 2011/125677 A1 | 10/2011 |
| WO | 2014/024348 A1 | 2/2014 |

OTHER PUBLICATIONS

Notice of Allowance issued in U.S. Appl. No. 15/878,902, dated Feb. 6, 2019.
Non-final Office Action issued in U.S. Appl. No. 14/972,153, dated Jul. 6, 2017.
Notice of Allowance issued in U.S. Appl. No. 14/972,153, dated Oct. 25, 2017.
Non-Final Office Action issued in corresponding U.S. Appl. No. 16/401,974, dated Feb. 10, 2020.
Notice of Allowance issued in corresponding U.S. Appl. No. 16/401,974, dated May 8, 2020.

* cited by examiner

IMAGING DEVICE INCLUDING PHOTOELECTRIC CONVERTER AND CIRCUITRY INCLUDING A FIRST CAPACITANCE ELEMENT, A SECOND CAPACITANCE ELEMENT AND A TRANSISTOR

CROSS-REFERENCE TO RELATED APPLICATIONS

This application is a continuation of U.S. patent application Ser. No. 16/401,974, filed May 2, 2019, which is a continuation of U.S. patent application Ser. No. 15/878,902, filed on Jan. 24, 2018, now U.S. Pat. No. 10,325,945, which is a continuation of U.S. patent application Ser. No. 14/972,153, filed on Dec. 17, 2015, now U.S. Pat. No. 9,917,119, which claims priority to Japanese Patent Application No. 2014-264695, filed on Dec. 26, 2014; Japanese Patent Application No. 2014-264694, filed on Dec. 26, 2014, Japanese Patent Application No. 2015-167556, filed on Aug. 27, 2015 and Japanese Patent Application No. 2015-207381, filed on Oct. 21, 2015, the entire disclosures each of which are hereby incorporated by reference.

BACKGROUND

1. Technical Field

The present disclosure relates to an imaging device. More specifically, the present disclosure relates to an imaging device that has a photoelectric conversion unit including a photoelectric conversion film and stacking on a semiconductor substrate.

2. Description of the Related Art

A multilayer imaging device is proposed as an MOS (Metal Oxide Semiconductor) imaging device. In the multilayer imaging device, a photoelectric conversion unit including a photoelectric conversion film is stacked on a topmost surface of a semiconductor substrate, and an electric charge generated through photoelectric conversion in the photoelectric conversion film is accumulated in an electric charge accumulation region (called "floating diffusion"). The imaging device reads out the accumulated electric charge by using a CCD (Charge Coupled Device) circuit or a CMOS (Complementary MOS) circuit in the semiconductor substrate. For example, Japanese Unexamined Patent Application Publication No. 2009-164604 discloses such an imaging device.

In the field of imaging device, there are demands for a noise reduction. In particular, there are demands for a reduction of kTC noise generated at the time of reset (also referred to as "reset noise").

SUMMARY

One non-limiting and exemplary embodiment provides the following.

In one general aspect, the techniques disclosed here feature an imaging device including a semiconductor substrate; a photoelectric converter stacked on the semiconductor substrate, the photoelectric converter being configured to generate a signal through photoelectric conversion of incident light; a multilayer wiring structure located between the semiconductor substrate and the photoelectric converter; and circuitry located in the multilayer wiring structure and the semiconductor substrate, the circuitry being configured to detect the signal. The the circuitry includes a first capacitance element and a second capacitance element; and a first transistor including a first source and a first drain in the semiconductor substrate and a first gate. The first capacitance element includes a first electrode, a second electrode, and a dielectric film between the first electrode and the second electrode, the multilayer wiring structure includes an insulating layer adjacent to the first capacitance element, and a permittivity of the dielectric film is greater than a permittivity of the insulating layer.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
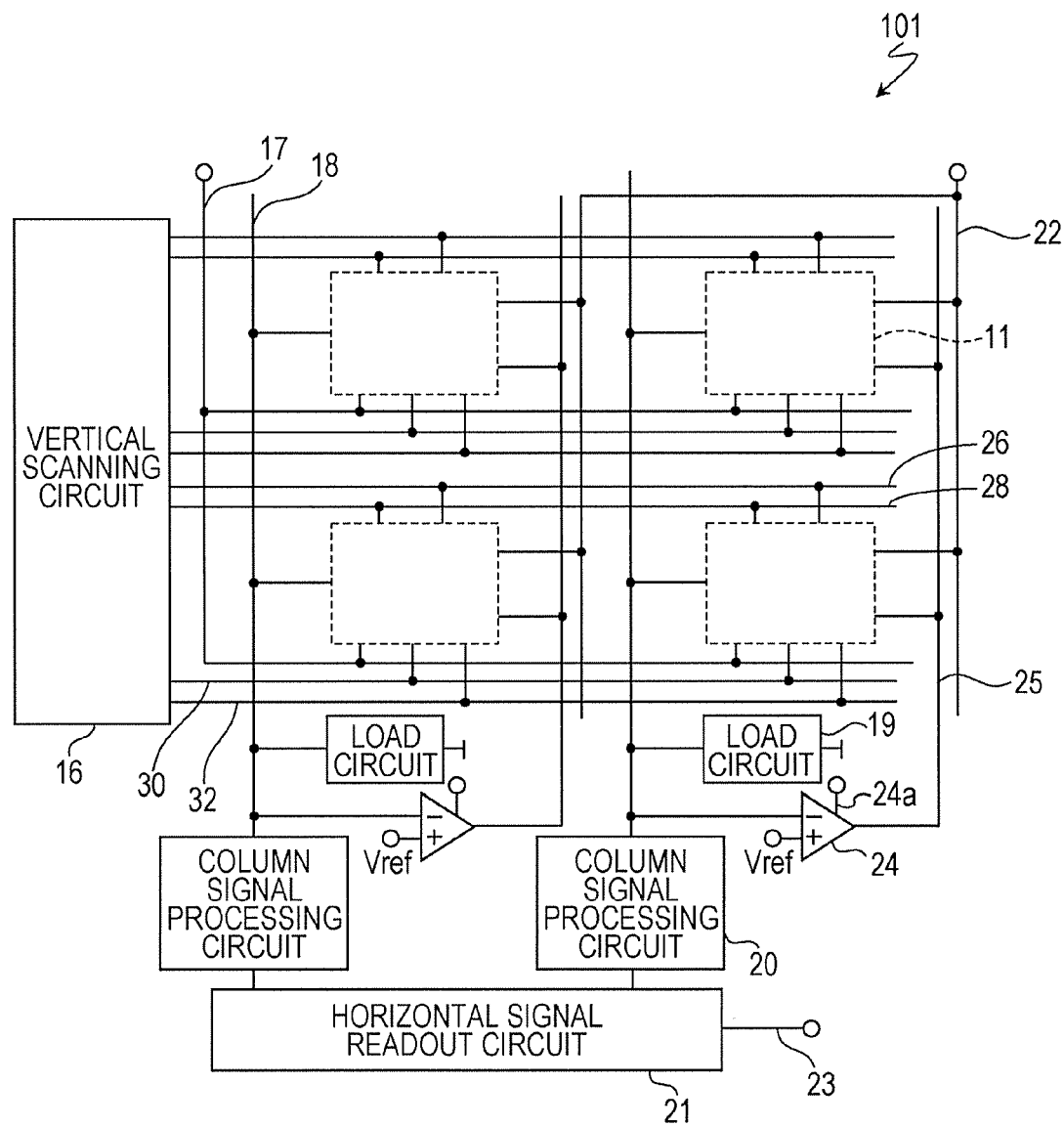
FIG. 1 is a schematic view illustrating an exemplary circuit configuration of an imaging device according to the First Embodiment.

The knowledge of the inventors of the present invention is described before detailed description of embodiments of the present disclosure.

A configuration in which three transistors are disposed in a pixel is known as a readout circuit for reading out an electric charge accumulated in an electric charge accumulation region. For example, FIG. 4 of Japanese Unexamined Patent Application Publication No. 2011-228621 illustrates a signal readout circuit that has an output transistor, a row selection transistor, and a reset transistor that resets floating diffusion. Furthermore, a readout circuit in which a transfer transistor that transfers an electric charge generated through photoelectric conversion to floating diffusion is further provided in a pixel is also known. For example, a signal readout circuit in FIG. 7 of Japanese Unexamined Patent Application Publication No. 2011-228621 has four transistors, i.e., a reset transistor, an output transistor, a row selection transistor, and a transistor for electric charge transfer. Out of these four transistors, the fourth transistor is connected between a pixel electrode and floating diffusion. The fourth transistor is a transfer transistor that transfers an electric charge generated through photoelectric conversion and collected by the pixel electrode to the floating diffusion. Hereinafter, a readout circuit that has a transfer transistor in a pixel is sometimes referred to as a "4Tr readout circuit". Meanwhile, a readout circuit that has no transfer transistor in a pixel is sometimes referred to as a "3Tr readout circuit". The entire contents of Japanese Unexamined Patent Application Publication No. 2011-228621 are hereby incorporated by reference.

It is known that in a so-called CCD image sensor or CMOS image sensor in which a photodiode is formed in a semiconductor substrate, the influence of kTC noise can be removed by applying correlated double sampling (CDS) to a 4Tr readout circuit. However, according to the studies of the inventors of the present invention, it is difficult to remove the influence of kTC noise in a multilayer imaging device by this method.

In a multilayer imaging device, a metal wire or a metal layer is typically interposed between a photoelectric conversion unit and a semiconductor substrate to electrically connect the photoelectric conversion unit and the semiconductor substrate. It is therefore difficult to completely transfer an electric charge collected by a pixel electrode to floating diffusion. Therefore, it cannot be said that simple application of a method in which a transfer transistor is provided in a pixel and correlated double sampling is applied is effective for a multilayer imaging device. It is desired that kTC noise be reduced in a multilayer imaging device.

One aspect of the present disclosure is summarized as follows.

[Item 1]

An imaging device including: a unit pixel cell comprising: a photoelectric converter that generates an electric signal through photoelectric conversion of incident light, the photoelectric converter comprising a first electrode, a second electrode, and a photoelectric conversion film that is located between the first electrode and the second electrode, the first electrode being located on a light receiving side of the photoelectric conversion film, a signal detection circuit that detects the electric signal, the signal detection circuit comprising a first transistor a gate of which is connected to the second electrode and a second transistor one of a source and a drain of which is connected to the second electrode, the first transistor amplifying the electric signal, and a capacitor circuit comprising a first capacitor having a first capacitance value and a second capacitor having a second capacitance value larger than the first capacitance value, the first capacitor and the second capacitor being serially connected to each other, the capacitor circuit being provided between the second electrode and a reference voltage; and a feedback circuit comprising the first transistor and an inverting amplifier, the feedback circuit negatively feeding back the electric signal to the other of the source and the drain of the second transistor via the first transistor and the inverting amplifier. According to the arrangement, kTC noise that occurs in a reset operation in a pixel can be effectively reduced by the capacitor circuit that is serially connected to the photoelectric converter.

[Item 2]

The imaging device according to Item 1, wherein the first capacitor is connected between the source and the drain of the second transistor.

[Item 3]

An imaging device including: a unit pixel cell comprising: a photoelectric converter that generates an electric signal through photoelectric conversion of incident light, the photoelectric converter comprising a first electrode, a second electrode, and a photoelectric conversion film that is located between the first electrode and the second electrode, the first electrode being located on a light receiving side of the photoelectric conversion film, a signal detection circuit that detects the electric signal, the signal detection circuit comprising a first transistor a gate of which is connected to the second electrode and a second transistor one of a source and a drain of which is connected to the second electrode, the first transistor amplifying the electric signal, and a capacitor circuit comprising a first capacitor having a first capacitance value and a second capacitor having a second capacitance value larger than the first capacitance value, the first capacitor and the second capacitor being serially connected to each other, the capacitor circuit being provided between the second electrode and a reference voltage, the first capacitor being connected between the source and the drain of the second transistor; and a feedback circuit that negatively feeds back the electric signal to the other of the source and the drain of the second transistor. According to the arrangement, the second transistor can be used as both a reset transistor and a gain switching transistor. This allows cells to be miniaturized. Furthermore, it is possible to reduce a transistor junction leakage to an electric charge accumulation node, thereby reducing a dark current.

[Item 4]

The imaging device according to any one of Items 1 through 3, wherein the second capacitor is connected to at least one of the source and the drain of the second transistor.

[Item 5]

The imaging device according to Item 3, wherein an amount of change of a voltage of the second electrode is switched by turning on and off the second transistor. According to the arrangement, it is possible to switch the sensitivity of the imaging device.

[Item 6]

The imaging device according to any one of Items 1 through 5, wherein the signal detection circuit further comprises a third transistor that selectively transmits output of the first transistor to the inverting amplifier.

[Item 7]

The imaging device according to any one of Items 1 through 6, wherein the signal detection circuit further comprises a fourth transistor that selectively transmits output of the inverting amplifier to the other of the source and the drain of the second transistor. According to the arrangement, the feedback circuit can be selectively formed by the second transistor.

[Item 8]

The imaging device according to any one of Items 1 through 6, wherein the signal detection circuit further comprises a fourth transistor that is connected between the source and the drain of the second transistor and selectively transmits the output of the inverting amplifier to the first capacitor.

[Item 9]

The imaging device according to any one of Items 3 through 8, wherein a feedback circuit comprises the first transistor and an inverting amplifier, the feedback circuit negatively feeding back the electric signal to the other of the source and drain of the second transistor via the first transistor and the inverting amplifier.

[Item 10]

The imaging device according to Item 3, wherein the first capacitor and the second transistor are connected in parallel to each other.

[Item 11]

An imaging device including: a unit pixel cell including: a photoelectric converter that performs photoelectric conversion of incident light, a signal detection circuit that detects a signal of the photoelectric converter, and a capacitor circuit in which a first capacitor and a second capacitor whose capacitance value is larger than the first capacitor are serially connected to each other, the photoelectric converter having a photoelectric conversion film, a first electrode formed on a light-receiving surface of the photoelectric conversion film, and a second electrode formed on a surface of the photoelectric conversion film that is opposite to the first electrode, the signal detection circuit including a first transistor that amplifies a signal voltage according to an voltage of the second electrode and outputs the amplified signal voltage and a second transistor, one of a source and a drain of the second transistor being connected to the second electrode, the capacitor circuit being provided between the second electrode and a reference voltage, the first capacitor being connected between the source and the drain of the second transistor, and an amount of change of the voltage of the second electrode being switched by turning on and off the second transistor. According to the arrangement, it is possible to provide an imaging device that can switch the imaging sensitivity.

[Item 12]

The imaging device according to Item 11, wherein the second transistor is switched on and off in accordance with an imaging mode.

[Item 13]

The imaging device according to Item 12, wherein the imaging mode includes a mode for imaging a bright subject and a mode for imaging a dark subject.

[Item 14]

An imaging device including: a unit pixel cell including: a photoelectric converter that performs photoelectric conversion of incident light and a signal detection circuit that detects a signal of the photoelectric converter, the photoelectric converter having a photoelectric conversion film, a first electrode formed on a light-receiving surface of the photoelectric conversion film, and a second electrode formed on a surface of the photoelectric conversion film that is opposite to the first electrode, the signal detection circuit including an amplifier transistor, a reset transistor, a first capacitor, and a second capacitor having a capacitance value larger than that of the first capacitor, a gate of the amplifier transistor being connected to the second electrode and one of a source and a drain of the reset transistor being connected to the second electrode, the amplifier transistor and the reset transistor being formed on an identical semiconductor substrate, the second capacitor having a first insulating film that is provided on part of the semiconductor substrate and a third electrode that faces part of the semiconductor substrate via the first insulating film, the first capacitor having a second insulating film that is formed on the third electrode and a fourth electrode that is connected to the second electrode, at least part of the fourth electrode overlapping the third electrode via the second insulating film when viewed from the normal to the semiconductor substrate.

According to the arrangement of Item 14, kTC noise that occurs due to reset can be reduced while suppressing an increase in capacitance value of the entire signal electric charge accumulation region.

[Item 15]

The imaging device according to Item 14, further including a feedback circuit that negatively feeds back output of the signal detection circuit, an output wire of the feedback circuit being connected to the other of the source and the drain of the reset transistor.

According to the arrangement of Item 15, kTC noise that has occurred can be cancelled in a relatively short period.

[Item 16]

The imaging device according to Item 14 or 15, wherein part of the semiconductor substrate is connected to a voltage source that supplies a voltage for sensitivity adjustment.

According to the arrangement of Item 16, it is possible to control the voltage of an electric charge accumulation node in which a signal electric charge is accumulated, and it is therefore possible to adjust the sensitivity of the imaging device.

[Item 17]

The imaging device according to any one of Items 14 through 16, wherein the third electrode is connected to the other of the source and the drain of the reset transistor.

According to the arrangement of Item 17, it is possible to select whether to connect the second capacitor to the electric charge accumulation node via the first capacitor or connect the second capacitor to the electric charge accumulation node via the reset transistor by switching ON and OFF of the reset transistor.

[Item 18]

The imaging device according to any one of Items 14 through 17, wherein signal detection circuit has an address transistor that is formed on the semiconductor substrate and that supplies output of the amplifier transistor as input to the feedback circuit in accordance with an input signal.

According to the arrangement of Item 18, reset and/or noise cancelling can be performed by selecting one of a plurality of unit pixel cells that share a feedback wire.

[Item 19]

The imaging device according to any one of Items 14 through 18, wherein the fourth electrode is part of a wiring layer that connects the gate of the amplifier transistor and one of the source and the drain of the reset transistor.

According to the arrangement of Item 19, it is possible to form the first capacitor in the unit pixel cell without increasing the number of steps.

[Item 20]

The imaging device according to any one of Items 14 through 19, wherein the third electrode and the fourth electrode are made of polysilicon.

According to the arrangement of Item 20, it is possible to provide a high-precision first capacitor having a flat CV characteristic.

[Item 21]

The imaging device according to any one of Items 14 through 20, further including a fifth electrode that overlaps the third electrode via the second insulating film and has a third capacitor electrically connected to part of the semiconductor substrate.

According to the arrangement of Item 21, it is possible to further form a capacitor that is electrically connected to the second capacitor without adding a special step. This makes it possible to obtain a larger composite capacitance, thereby making it possible to more effectively reduce kTC noise.

[Item 22]

An imaging device including: a unit pixel cell including: a photoelectric converter that performs photoelectric conversion of incident light and a signal detection circuit that detects a signal generated by the photoelectric converter, the photoelectric converter having a photoelectric conversion film, a first electrode formed on a light-receiving surface of the photoelectric conversion film, and a second electrode formed on a surface of the photoelectric conversion film that is opposite to the first electrode, the signal detection circuit including an amplifier transistor, a reset transistor, a first capacitor, and a second capacitor having a capacitance value larger than that of the first capacitor, a gate of the amplifier transistor being connected to the second electrode and one of a source and a drain of the reset transistor being connected to the second electrode, the amplifier transistor and the reset transistor being formed on an identical semiconductor substrate, the second capacitor having a third electrode disposed between the semiconductor substrate and the second electrode, a fourth electrode disposed farther from the second electrode than the third electrode, and a first dielectric layer disposed between the third electrode and the fourth electrode.

According to the arrangement of Item 22, kTC noise that occurs due to reset can be reduced while suppressing an increase in capacitance value of the entire signal electric charge accumulation region.

[Item 23]

The imaging device according to Item 22, wherein the fourth electrode of the second capacitor is an impurity region formed on the semiconductor substrate; the first capacitor includes a second dielectric layer; at least part of one of electrodes of the first capacitor overlaps the third electrode when viewed from the normal to the semiconductor substrate; the second dielectric layer of the first capacitor is disposed between the one of the electrodes and the third electrode.

According to the arrangement of Item 23, it is possible to form a second capacitor having a relatively high capacitance while suppressing an increase in the number of production steps.

[Item 24]

The imaging device according to Item 23, wherein one of the electrodes is part of a wiring layer that connects the gate of the amplifier transistor and one of the source and the drain of the reset transistor.

According to the arrangement of Item 24, it is possible to form a first capacitor in a unit pixel cell without increasing the number of steps.

[Item 25]

The imaging device according to Item 23 or 24, further including a fifth electrode that overlaps the third electrode via the second dielectric layer and that has a third capacitor electrically connected to the fourth electrode.

According to the arrangement of Item 25, it is possible to further form a capacitor that is electrically connected to the second capacitor without adding a special step. This makes it possible to obtain a larger composite capacitance, thereby making it possible to more effectively reduce kTC noise.

[Item 26]

The imaging device according to any one of Items 22 through 25, wherein the third electrode is connected to the other of the source and the drain of the reset transistor.

According to the arrangement of Item 26, it is possible to select whether to connect the second capacitor to the electric charge accumulation node via the first capacitor or connect the second capacitor to the electric charge accumulation node via the reset transistor by switching ON and OFF of the reset transistor.

[Item 27]

The imaging device according to any one of Items 22 through 26, further including a feedback circuit that negatively feeds back output of the signal detection circuit, an output line of the feedback circuit being connected to the other of the source and the drain of the reset transistor.

According to the arrangement of Item 27, kTC noise that is occurred can be cancelled in a relatively short period.

[Item 28]

The imaging device according to Items 27, wherein the signal detection circuit has an address transistor that is formed on the semiconductor substrate and that supplies output of the amplifier transistor as input to the feedback circuit in accordance with an input signal.

According to the arrangement of Item 28, reset and/or noise cancelling can be performed by selecting one of a plurality of unit pixel cells that share a feedback wire.

[Item 29]

The imaging device according to any one of Items 22 through 28, wherein the fourth electrode is connected to a voltage source that supplies a voltage for sensitivity adjustment.

According to the arrangement of Item 29, it is possible to control the voltage of an electric charge accumulation node in which a signal electric charge is accumulated, and it is therefore possible to adjust the sensitivity of the imaging device.

Embodiments of the present disclosure are described below in detail with reference to the drawings. Note that each of the embodiments below illustrates a general or specific example. Numerical values, shapes, materials, constituent elements, the way in which the constituent elements are disposed and connected, steps, the order of steps in the embodiments below are examples and do not limit the present disclosure. Various aspects described in the present specification can be combined as long as no contradiction occurs. Among the constituent elements in the embodiments below, constituent elements that are not described in independent claims showing highest concepts are described as optional constituent elements. In the following description, constituent elements that have substantially the same functions are indicated by common reference signs, and description thereof may be omitted.

First Embodiment

FIG. 1 schematically illustrates an exemplary circuit configuration of an imaging device according to the First Embodiment. An imaging device 101 illustrated in FIG. 1 includes a plurality of unit pixel cells 11 and a peripheral circuit. The plurality of unit pixel cells 11 are disposed in a two-dimensional array on a semiconductor substrate and form a photosensitive region (pixel region). The semiconductor substrate is not limited to a substrate that is entirely made of a semiconductor. The semiconductor substrate may be, for example, an insulating substrate that has a semiconductor layer on the side on which the photosensitive region is formed.

In the example illustrated in FIG. 1, the plurality of unit pixel cells 11 are arranged in a row direction and a column direction. The "row direction" and "column direction" as used herein refer to a direction in which rows extend and a direction in which columns extend, respectively. That is, the vertical direction of the paper on which FIG. 1 is drawn is the column direction, and the horizontal direction of the paper is the row direction. The plurality of unit pixel cells 11 may be disposed in a one-dimensional array. In other words, the imaging device 101 can be a line sensor.

Each of the unit pixel cells 11 is connected to a power source wire 22. A predetermined power source voltage is supplied to each of the unit pixel cells 11 via the power source wire 22. As described later in detail, each of the unit pixel cells 11 includes a photoelectric conversion unit having a photoelectric conversion film and stacking on the semiconductor substrate. As illustrated in FIG. 1, the imaging device 101 includes an accumulation control wire 17 for applying an identical constant voltage to all of the photoelectric conversion units.

The peripheral circuit of the imaging device 101 includes a vertical scanning circuit (also referred to as a "row scanning circuit") 16, a load circuit 19, a column signal processing circuit (also referred to as a "row signal accumulation circuit") 20, a horizontal signal readout circuit (also referred to as a "column scanning circuit") 21, and an inverting amplifier 24. In the configuration illustrated in FIG. 1, the column signal processing circuit 20, the load circuit 19, and the inverting amplifier 24 are disposed for each column of the unit pixel cells 11 that are disposed in a two-dimensional array. That is, in this example, the peripheral circuit includes a plurality of column signal processing circuits 20, a plurality of load circuits 19, and a plurality of inverting amplifiers 24.

The vertical scanning circuit 16 is connected to an address signal wire 30 and a reset signal wire 26. The vertical scanning circuit 16 selects a row of a plurality of unit pixel cells 11 by applying a predetermined voltage to the address signal wire 30. This executes readout of signal voltages of the selected unit pixel cells 11 and reset of pixel electrodes that will be described later.

In the example illustrated in FIG. 1, the vertical scanning circuit 16 is also connected to a feedback control wire 28 and a sensitivity adjustment wire 32. As described later, the vertical scanning circuit 16 applies a predetermined voltage to the feedback control wire 28. This can form a feedback circuit that negatively feeds back output of the unit pixel cells 11. Furthermore, the vertical scanning circuit 16 can supply a predetermined voltage to the plurality of unit pixel cells 11 via the sensitivity adjustment wire 32. As described later in detail, in the present disclosure, each of the unit pixel cells 11 has one or more capacitors in a pixel. The term "capacitor" as used herein refers to a structure in which a dielectric such as an insulating film is sandwiched between electrodes. The term "electrode" as used herein is not limited to an electrode made of a metal and is broadly interpreted as encompassing a polysilicon layer and the like. The term "electrode" as used herein may be part of the semiconductor substrate.

The unit pixel cells 11 disposed in each column are electrically connected to the column signal processing circuit 20 via a vertical signal wire 18 corresponding to the column. The load circuit 19 is electrically connected to the vertical signal wire 18. The column signal processing circuit 20 performs noise suppression signal processing represented by correlated double sampling, analog-digital conversion (AD conversion), and the like. The horizontal signal readout circuit 21 is electrically connected to the plurality of column signal processing circuits 20 that correspond to the columns of the unit pixel cells 11. The horizontal signal readout circuit 21 sequentially reads out a signal from the plurality of column signal processing circuits 20 and supplies the signal to a horizontal common signal wire 23.

In the configuration illustrated in FIG. 1, the plurality of inverting amplifiers 24 are provided so as to correspond to the respective columns. A negative-side input terminal of each of the inverting amplifiers 24 is connected to a corresponding vertical signal wire 18. A predetermined voltage (e.g., a positive voltage of 1 V or close to 1 V) Vref is supplied to a positive-side input terminal of the inverting amplifier 24. An output terminal of the inverting amplifier 24 is connected to the plurality of unit pixel cells 11 which are connected to the negative-side input terminal of the inverting amplifier 24 via a feedback wire 25 provided corresponding to each column. The inverting amplifier 24 constitutes part of the feedback circuit that negatively feeds back output from the unit pixel cells 11. The inverting amplifier 24 may be called a feedback amplifier. The inverting amplifier 24 includes a gain adjusting terminal 24a that changes inverting amplifier gain. Operation of the inverting amplifier 24 will be described later.

Figure 2:
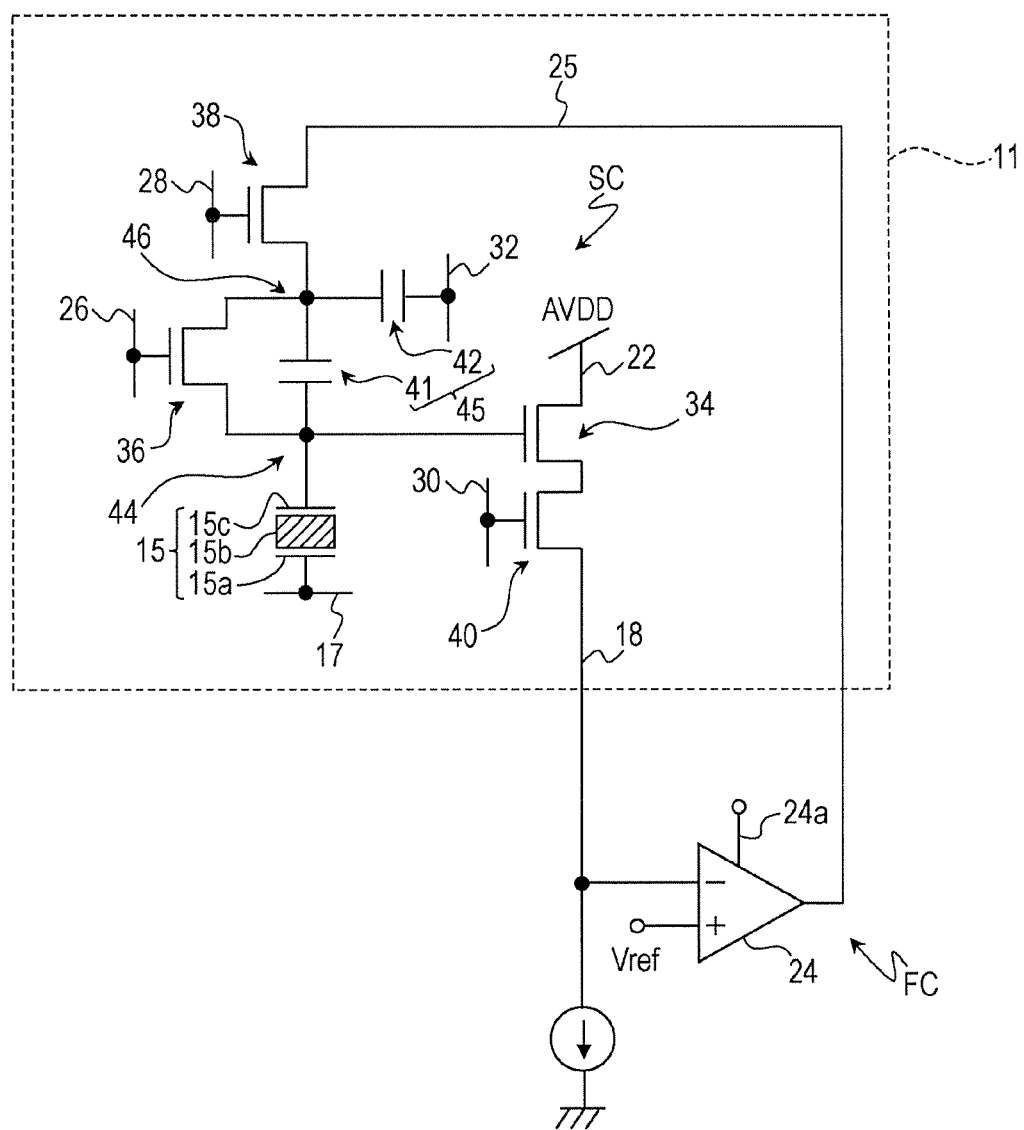
FIG. 2 is a schematic view illustrating an exemplary circuit configuration of a unit pixel cell illustrated in FIG. 1.

FIG. 2 illustrates an exemplary circuit configuration of each of the unit pixel cells 11 illustrated in FIG. 1. The unit pixel cell 11 includes a photoelectric conversion unit 15 and a signal detection circuit SC.

The photoelectric conversion unit 15 typically has a structure in which a photoelectric conversion film 15b is sandwiched between a first electrode 15a and a second electrode (pixel electrode) 15c. As described later with reference to the drawings, the photoelectric conversion film 15b is stacked on the semiconductor substrate on which the unit pixel cells 11 are formed. The photoelectric conversion film 15b is made of an organic material or an inorganic material such as amorphous silicon. The photoelectric conversion film 15b may include a layer made of an organic material and a layer made of an inorganic material.

The first electrode 15a is provided on a light-receiving surface side of the photoelectric conversion film 15b. The first electrode 15a is made of a transparent conductive material such as ITO. The second electrode 15c is provided on a surface of the photoelectric conversion film 15b on the opposite side of the first electrode 15a. The second electrode 15c collects an electric charge generated through photoelectric conversion in the photoelectric conversion film 15b. The second electrode 15c is made of metal such as aluminum or copper, a metal nitride, polysilicon that is doped with impurities to be electrically conductive, or the like.

As illustrated in FIG. 2, the first electrode 15a is connected to the accumulation control wire 17, and the second electrode 15c is connected to an electric charge accumulation node (also referred to as a "floating diffusion node") 44. By controlling the voltage of the first electrode 15a via the accumulation control wire 17, any one of hole and electron of a hole-electron pair generated through photoelectric conversion can be collected by the second electrode 15c. In a case where a hole is used as a signal electric charge, the voltage of the first electrode 15a need just be made higher than that of the second electrode 15c. The case where a hole is used as a signal electric charge is described below as an example. For example, a voltage of approximately 10V is applied to the first electrode 15a via the accumulation control wire 17. This causes a signal electric charge to be accumulated in the electric charge accumulation node 44. Needless to say, an electron may be used as the signal electric charge.

The signal detection circuit SC of the unit pixel cell 11 includes an amplifier transistor (first transistor) 34 and a first reset transistor (second transistor) 36. The unit pixel cell 11 includes a capacitor circuit 45 in which a first capacitor (first capacitor) 41 and a second capacitor (second capacitor) 42 are connected in series. In the configuration illustrated in FIG. 2, the second capacitor 42 has a larger capacitance value than the first capacitor 41. In the configuration illustrated in FIG. 2, one of a source and a drain of the first reset transistor 36 and one of electrodes of the first capacitor 41 are connected to the electric charge accumulation node 44. That is, one of the source and the drain of the first reset transistor 36 and one of the electrodes of the first capacitor 41 have electrical connection with the second electrode 15c. The other of the source and drain of the first reset transistor 36 and the other of the electrodes of the first capacitor 41 are connected to one of electrodes of the second capacitor 42. That is, in this embodiment, the first capacitor and the first reset transistor are connected in parallel. This may cause junction leak of transistor against the electric charge accumulation node 44 to be reduced. Accordingly, dark current may be reduced. Hereinafter, a node including a connection point between the first capacitor 41 and the second capacitor 42 is sometimes referred to as a reset drain node 46.

Out of the electrodes of the second capacitor 42, an electrode that is not connected to the reset drain node 46 is connected to the sensitivity adjustment wire 32. The voltage of the sensitivity adjustment wire 32 is set, for example, to 0 V (reference voltage). The voltage of the sensitivity adjustment wire 32 need not be fixed during operation of the imaging device 101. For example, a pulse voltage may be supplied from the vertical scanning circuit 16. As described later, the sensitivity adjustment wire 32 can be used for control of the voltage of the electric charge accumulation node 44. Needless to say, the voltage of the sensitivity adjustment wire 32 may be fixed during operation of the imaging device 101.

As illustrated in FIG. 2, the gate of the amplifier transistor 34 is connected to the electric charge accumulation node 44. In other words, the gate of the amplifier transistor 34 has electric connection with the second electrode 15c. One of a drain and a source (the drain in the case of an N-channel MOS) of the amplifier transistor 34 is connected to the power source wire (source follower power source) 22, and the other of the drain and the source of the amplifier transistor 34 is connected to the vertical signal wire 18. The amplifier transistor 34 and the load circuit 19 (not illustrated in FIG. 2, see FIG. 1) constitute a source follower circuit. The amplifier transistor 34 amplifies a signal generated by the photoelectric conversion unit 15.

As illustrated in FIG. 2, the unit pixel cell 11 includes an address transistor (third transistor) 40. A source or a drain of the address transistor 40 is connected to one of the source and drain of the amplifier transistor 34 which one is not connected to the power source wire 22. The gate of the address transistor 40 is connected to the address signal wire 30. In the configuration illustrated in FIG. 2, the address transistor 40 constitutes part of the signal detection circuit SC.

A voltage that varies depending on the amount of signal electric charge accumulated in the electric charge accumulation node 44 is applied to the gate of the amplifier transistor 34. The amplifier transistor 34 amplifies this voltage. The voltage amplified by the amplifier transistor 34 is selectively read out by the address transistor 40 as a signal voltage.

In the configuration illustrated in FIG. 2, the unit pixel cell 11 further includes a second reset transistor (fourth transistor) 38. One of a source and a drain of the second reset transistor 38 is connected to the reset drain node 46, and the other of the source and the drain of the second reset transistor 38 is connected to the feedback wire 25. That is, in the configuration illustrated in FIG. 2, one of the source and drain of the first reset transistor 36 which one is connected to the reset drain node 46 is connected to the feedback wire 25 via the second reset transistor 38. The gate of the second reset transistor 38 is connected to the feedback control wire 28. As described later in detail, by controlling the voltage of the feedback control wire 28, a feedback circuit FC that negatively feeds back output of the signal detection circuit SC can be formed.

Note that each of the amplifier transistor 34, the first reset transistor 36, the address transistor 40, and the second reset transistor 38 may be an N-channel MOS or may be a P-channel MOS. It is not necessary that all of these transistors are either N-channel MOS or P-channel MOS. A case where the amplifier transistor 34, the first reset transistor 36, the address transistor 40, and the second reset transistor 38 are N-channel MOS is described below. Note only field-effect transistors (FETs) but also bipolar transistors can be used as the transistors.

Outline of Operation of Imaging Device 101

Next, an example of operation of the imaging device 101 is described with reference to the drawings. As described below, according to the configuration illustrated in FIG. 2, two operation modes that are different in sensitivity can be switched by appropriately controlling the gate voltage of the first reset transistor 36 and the gate voltage of the second reset transistor 38. The two operation modes are a first mode in which imaging with relatively high sensitivity is possible and a second mode in which imaging with relatively low sensitivity is possible.

First, an outline of operation of the imaging device 101 in the first mode is described. The first mode is a mode suitable for imaging under low illuminance. Under low illuminance, high sensitivity is useful. However, in a case where sensitivity is relatively high, there is a risk of amplification of noise. According to the embodiment of the present disclosure, it is possible to reduce and/or remove the influence of kTC noise while achieving relatively high sensitivity.

Figure 3:
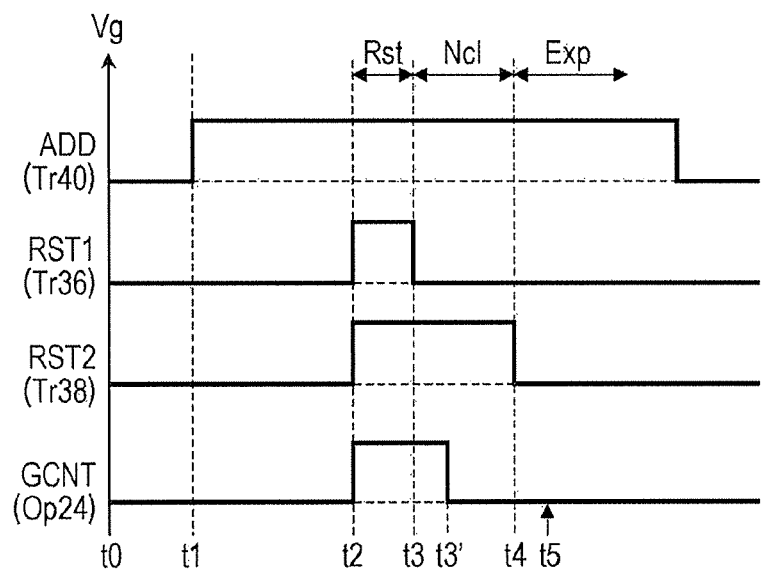
FIG. 3 is a timing diagram for explaining an example of operation of transistors in a first mode in the imaging device according to the First Embodiment.

FIG. 3 is a timing diagram for explaining an example of operation of the transistors in the first mode. In FIG. 3, ADD, RST1, RST2, and GCNT schematically illustrate examples of changes of the gate voltage of the address transistor 40, the gate voltage of the first reset transistor 36, the gate voltage of the second reset transistor 38, and the voltage applied to the gain adjusting terminal 24a of the inverting amplifier 24, respectively. In the example illustrated in FIG. 3, at a time t0, the address transistor 40, the first reset transistor 36, and the second reset transistor 38 are OFF. The voltage of the gain adjusting terminal 24a of the inverting amplifier 24 is a predetermined value. For simplification, description of operation of an electronic shutter is omitted below.

First, the address transistor 40 is turned ON (a time t1) by controlling the voltage of the address signal wire 30. At this point in time, a signal electric charge accumulated in the electric charge accumulation node 44 is read out.

Next, the first reset transistor 36 and the second reset transistor 38 are turned ON (a time t2) by controlling the voltage of the reset signal wire 26 and the voltage of the feedback control wire 28. This causes the electric charge accumulation node 44 and the feedback wire 25 to be connected to each other via the first reset transistor 36 and the second reset transistor 38, thus forming the feedback circuit FC that negatively feeds back the output of the signal detection circuit SC. Interposing the second reset transistor 38 between the reset drain node 46 and the feedback wire 25 enables the feedback circuit that feeds back the signal of the photoelectric conversion unit 15 to be formed selectively by the reset transistor 38. In this example, formation of the feedback circuit FC is performed for one of the plurality of unit pixel cells 11 that share the feedback wire 25. The unit pixel cell 11 for which formation of the feedback circuit FC is performed can be selected by control of the gate voltage of the address transistor 40. Accordingly, reset and/or noise cancelling, which are described below, can be performed to the desired unit pixel cell 11.

The feedback circuit FC is a negative-feedback amplifier circuit that includes the amplifier transistor 34, the inverting amplifier 24, and the second reset transistor 38. The address transistor 40, which was turned ON at the time t1, supplies output of the amplifier transistor 34 as input to the feedback circuit FC.

Since the electric charge accumulation node 44 and the feedback wire 25 are electrically connected to each other, the electric charge accumulation node 44 is reset. At this point in time, the output of the signal detection circuit SC is negatively fed back, thereby causing the voltage of the vertical signal wire 18 to converge to the voltage Vref applied to the positive-side input terminal of the inverting amplifier 24. That is, in this example, a reference voltage at the time of reset is the voltage Vref. In the configuration illustrated in FIG. 2, the voltage Vref can be set to any value within a range between a power source voltage (e.g., 3.3 V) and grounding (0 V). In other words, any voltage within a certain range (e.g., a voltage other than the power source voltage) can be used as the reference voltage at the time of reset.

Furthermore, at the time t2, the gain of the inverting amplifier 24 is reduced by controlling the voltage of the gain adjusting terminal 24a of the inverting amplifier 24. In the inverting amplifier 24, the product G×B of the gain G and the band B is constant. Accordingly, the reduction of the gain G makes the band B wider (makes a cutoff frequency higher). Therefore, convergence described above can be performed faster in the negative-feedback amplifier circuit.

Next, the first reset transistor 36 is turned OFF (a time t3). Hereinafter, a period from the point in time at which the first reset transistor 36 and the second reset transistor 38 are turned ON at the time t2 to the point in time at which the first reset transistor 36 is turned OFF (the period from the time t2 to the time t3 in FIG. 3) is sometimes referred to as a "reset period". In FIG. 3, the reset period is schematically indicated by the arrow Rst. When the first reset transistor 36 is turned OFF at the time t3, kTC noise occurs. Therefore, the kTC noise is added to the voltage of the electric charge accumulation node 44 after reset.

As is clear from FIG. 2, the state where the feedback circuit FC is formed is maintained during the period in which the second reset transistor 38 is ON. This allows the kTC noise that occurs when the first reset transistor 36 is turned OFF at the time t3 to be cancelled down to 1/(1+A) where A is the gain of the feedback circuit FC.

In this example, the voltage of the vertical signal wire 18 immediately before the first reset transistor 36 is turned OFF (immediately before the start of noise cancelling) is almost equal to the voltage Vref applied to the negative-side input terminal of the inverting amplifier 24. By thus making the voltage of the vertical signal wire 18 at the start of noise cancelling close to the target voltage Vref after noise cancelling, it is possible to cancel the kTC noise in a relatively short time. Hereinafter, a period from the point in time at which the first reset transistor 36 is turned OFF to the point in time at which the second reset transistor 38 is turned OFF (the period from the time t3 to the time t4) is sometimes referred to as a "noise cancelling period". In FIG. 3, the noise cancelling period is schematically indicated by the arrow Ncl.

At the time t3, the gain of the inverting amplifier 24 is in a reduced state. Therefore, noise cancelling can be performed fast in an initial stage of the noise cancelling period.

Subsequently, at a time t3', the gain of the inverting amplifier 24 is increased by controlling the voltage of the gain adjusting terminal 24a of the inverting amplifier 24. This further reduces the noise level. Since the product G×B of the gain G and the band B is constant, the increase in the gain G narrows the band B (lowers the cutoff frequency). That is, convergence in the negative-feedback amplifier circuit takes time. However, since the voltage of the vertical signal wire 18 has been already controlled to the vicinity of the convergence level during the period between t3 and t3', the width of the voltage that should be converged has been made small, and therefore an increase in convergence time caused by the narrowed band can be suppressed.

As described above, according to the embodiment of the present disclosure, the kTC noise that occurs when the reset transistor is turned OFF can be reduced, and the kTC noise that has occurred can be cancelled in a relatively short time.

Next, the second reset transistor 38 is turned OFF (the time t4), and exposure is performed for a predetermined period. When the second reset transistor 38 is turned OFF at the time t4, kTC noise occurs. The size of kTC noise added to the voltage of the electric charge accumulation node 44 at this point in time is $(Cfd/C2)^{1/2} \times (C1/(C1+Cfd))$ times as large as that in a case where the first capacitor 41 and the second capacitor 42 are not provided in the unit pixel cell 11 and the second reset transistor 38 is directly connected to the electric charge accumulation node 44. In this formula, Cfd, C1, and C2 represent the capacitance value of the electric charge accumulation node 44, the capacitance value of the first capacitor 41, and the capacitance value of the second capacitor 42. Note that "x" in this formula represents multiplication. As the capacitance value C2 of the second capacitor 42 becomes larger, the noise itself that occurs becomes smaller, and as the capacitance value C1 of the first capacitor 41 becomes smaller, the attenuation rate becomes larger. Therefore, according to the embodiment of the present disclosure, the kTC noise that occurs when the second reset transistor 38 is turned OFF can be sufficiently reduced by appropriately setting the capacitance value C1 of the first capacitor 41 and the capacitance value C2 of the second capacitor 42.

In FIG. 3, the period of exposure is schematically indicated by the arrow Exp. During the period of exposure, the reset voltage in which the kTC noise has been cancelled is read out at a predetermined timing (a time t5). Note that since it takes a short time to read out the reset voltage, readout of the reset voltage may be performed while the address transistor 40 is in an ON state.

A signal from which fixed noise has been removed can be obtained by calculating a difference between the signal read out during the period between the time t1 and the time t2 and the signal read out at the time t5. In this way, a signal from which the kTC noise and the fixed noise have been removed can be obtained.

Note that the second capacitor 42 is connected to the electric charge accumulation node 44 via the first capacitor 41 in a state in which the first reset transistor 36 and the second reset transistor 38 are OFF. Assume that the electric charge accumulation node 44 and the second capacitor 42 are directly connected to each other without the first capacitor 41. In this case, the capacitance value of the entire signal electric charge accumulation region in the case where the second capacitor 42 is directly connected is (Cfd+C2). That is, in a case where the second capacitor 42 has a relatively large capacitance value C2, the capacitance value of the entire signal electric charge accumulation region is also large, and therefore a high conversion gain (i.e., a high SN ratio) cannot be obtained.

In view of this, in the embodiment of the present disclosure, the second capacitor 42 is connected to the electric charge accumulation node 44 via the first capacitor 41. In such a configuration, the capacitance value of the entire signal electric charge accumulation region is expressed by (Cfd+(C1C2)/(C1+C2)). In a case where the first capacitor 41 has a relatively small capacitance value C1 and the second capacitor 42 has a relatively large capacitance value C2, the capacitance value of the entire signal electric charge accumulation region is approximately (Cfd+C1). That is, the increase of the capacitance value of the entire signal electric charge accumulation region is small. In this way, in a case where the second capacitor 42 is connected to the electric charge accumulation node 44 via the first capacitor 41 having a relatively small capacitance value, a decrease in conversion gain can be suppressed.

Next, an outline of operation of the imaging device 101 in the second mode in which imaging with relatively low sensitivity is possible is described with reference to FIG. 4. The second mode is a mode suitable for imaging under high illuminance. Under high illuminance, low sensitivity is more advantageous. Under relatively low sensitivity, the influence of noise is small, but a large capacitance value of the entire signal electric charge accumulation region is required.

Figure 4:
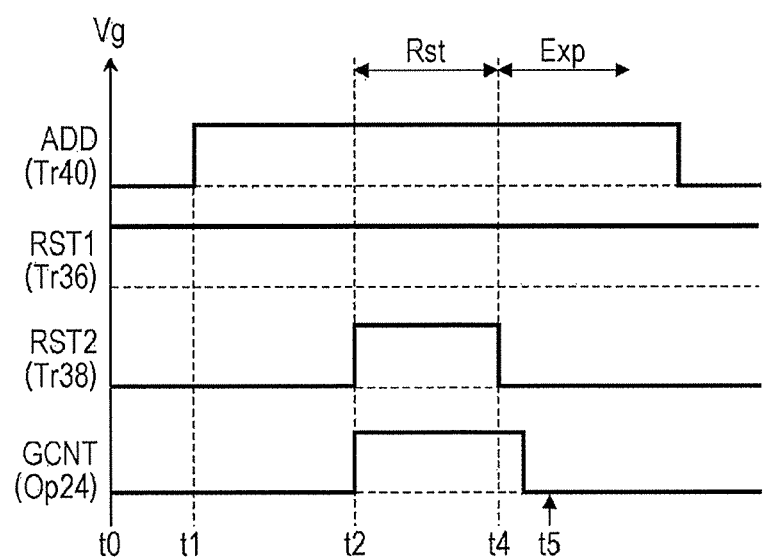
FIG. 4 is a timing diagram for explaining an example of operation of transistors in a second mode in the imaging device according to the First Embodiment.

FIG. 4 is a timing diagram for explaining an example of operation of the transistors in the second mode. In the first mode described with reference to FIG. 3, the electric charge accumulation node 44 is reset by using the first reset transistor 36. Meanwhile, in the second mode, the electric charge accumulation node 44 is reset by using the second reset transistor 38 while keeping the ON state of the first reset transistor 36 as described below.

As illustrated in FIG. 4, in the second mode, the first reset transistor 36 is always ON. At a time t1, the address transistor 40 is turned ON as in the first mode. At this point in time, a signal electric charge accumulated in the electric charge accumulation node 44 is read out. The voltage of the gain adjusting terminal 24*a* of the inverting amplifier 24 is a predetermined value.

Next, the second reset transistor 38 is turned ON (a time t2). This forms the feedback circuit FC that negatively feeds back the output of the signal detection circuit SC, thus resetting the electric charge accumulation node 44. A reference voltage at the time of reset is the voltage Vref applied to the positive-side input terminal of the inverting amplifier 24.

Furthermore, at the time t2, the gain of the inverting amplifier 24 is reduced by controlling the voltage of the gain adjusting terminal 24*a* of the inverting amplifier 24. Since the product G×B of the gain G and the band B is constant in the inverting amplifier 24, the reduction in the gain G widens the band B (increases the cutoff frequency). Therefore, convergence described above can be performed faster in the negative-feedback amplifier circuit.

Next, the second reset transistor 38 is turned OFF (a time t4). When the second reset transistor 38 is turned OFF, kTC noise occurs. In this example, at the time t4, the gain of the inverting amplifier 24 is in a reduced state. Therefore, convergence in the negative-feedback amplifier circuit can be performed fast. At the time t2, the gain of the inverting amplifier 24 may be increased by controlling the voltage of the gain adjusting terminal 24*a* of the inverting amplifier 24. In this case, convergence in the negative-feedback amplifier circuit takes time, but the band B can be narrowed (the cutoff frequency can be lowered). The voltage of the gain adjusting terminal 24*a* (in other words, the gain of the inverting amplifier 24) need just be appropriately set in consideration of an allowable time for noise reduction.

Then, exposure is performed for a predetermined period. During exposure, a reset voltage is read out at a predetermined timing (a time t5).

In the second mode, no noise cancelling period exists. However, in the second mode used for imaging under high illuminance, shot noise is dominant, and the influence of kTC noise is small. A signal from which fixed noise has been removed can be obtained by calculating a difference between the signal read out in the period between the time t1 and the time t2 and the signal read out at the time t5.

As is clear from the above description, in the configuration illustrated in FIG. 2, the first reset transistor 36 has both a function of a reset transistor that resets the electric charge accumulation node 44 and a function of a switch that switches the first mode and the second mode. This relatively easily allows unit pixel cells to be miniaturized. In this example, by switching ON and OFF of the first reset transistor 36, it is possible to switch whether to connect the second capacitor 42 to the electric charge accumulation node 44 via the first reset transistor 36 or connect the second capacitor 42 to the electric charge accumulation node 44 via the first capacitor 41. That is, switching ON and OFF of the first reset transistor 36 enables an amount of change of the voltage of the second electrode 15c to be switched, and enables sensitivity of the imaging device to be switched. In the configuration illustrated in FIG. 2, the first reset transistor 36 may thus be used as a gain switching transistor. The second capacitor 42 has both a function of reducing the kTC noise in the first mode and a function of increasing the capacitance value of the entire signal electric charge accumulation region. According to the embodiment of the present disclosure, a dynamic range can be increased with a simple configuration while suppressing an increase in the number of elements in a pixel. This is useful especially for miniaturization of pixels.

(Device Structure of Unit Pixel Cell 11 and Method for Producing Imaging Device 101)

Next, an example of a device structure of the unit pixel cell 11 is described with reference to FIGS. 5 and 6.

Figure 5:
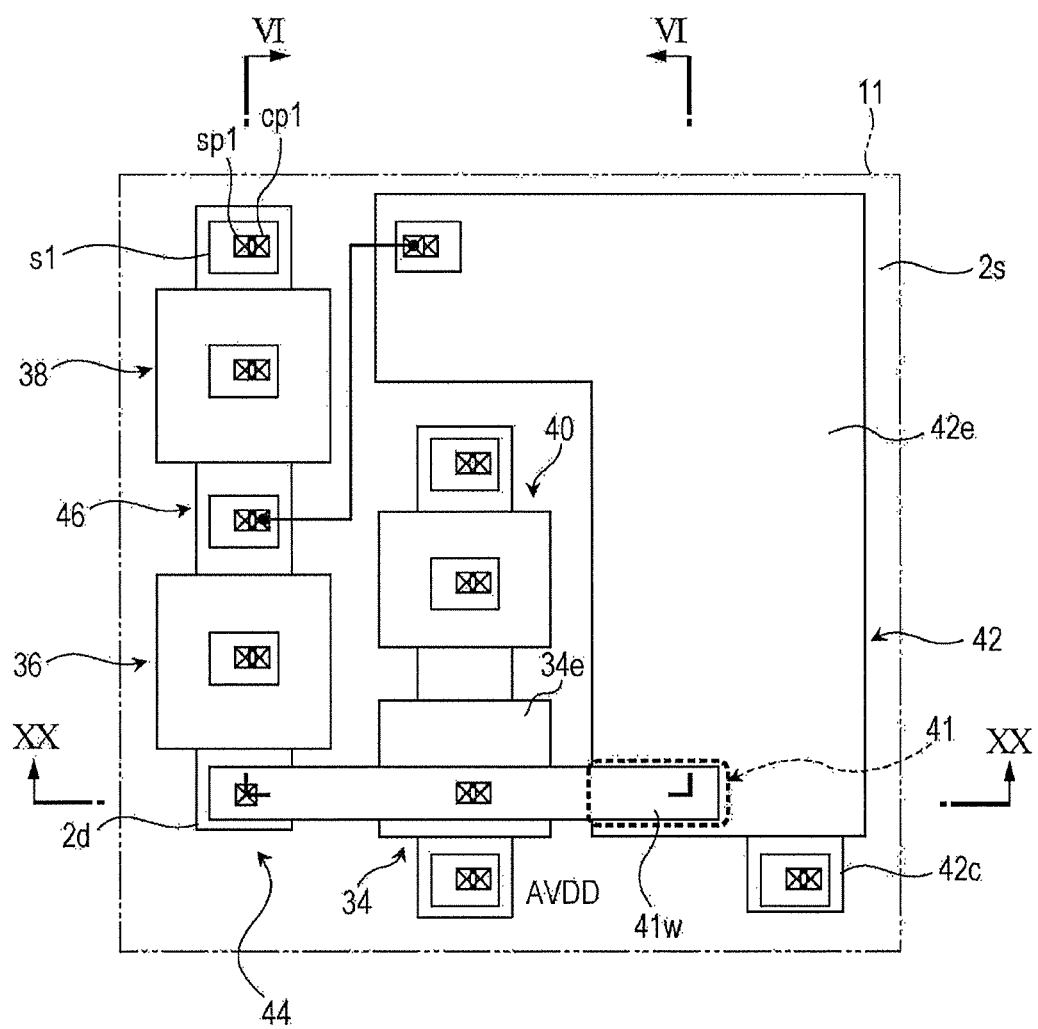
FIG. 5 is a plan view schematically illustrating an example of layout of elements in the unit pixel cell.

FIG. 5 schematically illustrates an example of layout of elements in the unit pixel cell 11. FIG. 6 schematically illustrates cross section taken along the line VI-VI of FIG. 5. As described above, the unit pixel cells 11 are arranged on the semiconductor substrate. In the following description, an example in which a P-type silicon (Si) substrate is used as a semiconductor substrate 2 (see FIG. 6) is described.

In the configuration illustrated in FIG. 5, four transistors, i.e., the amplifier transistor 34, the first reset transistor 36, the second reset transistor 38, and the address transistor 40 are disposed in the unit pixel cell 11. The unit pixel cells 11 are separated from each other by an element separation region 2s formed in the semiconductor substrate 2.

In this example, both of the amplifier transistor 34 and the first reset transistor 36 are formed on the semiconductor substrate 2. Furthermore, in this example, the second reset transistor 38 and the address transistor 40 are also formed on the semiconductor substrate 2. For example, the second reset transistor 38 includes impurity regions (N-type regions in this example) 2d formed in the semiconductor substrate 2. Each of these impurity regions 2d functions as the source or the drain of the second reset transistor 38. The impurity regions 2d are typically diffusion layers formed in the semiconductor substrate 2. Hereinafter, the impurity regions 2d in the semiconductor substrate 2 are sometimes referred to as "source/drain diffusion layers 2d". In the configuration illustrated in FIG. 5, one of the two source/drain diffusion layers 2d that constitute the source and the drain of the second reset transistor 38 is connected to the feedback wire 25 (not illustrated in FIG. 5, see FIG. 2) via a polysilicon plug sp1, a polysilicon layer s1, and a contact plug cp1.

The first capacitor 41 and the second capacitor 42 are also formed on the semiconductor substrate 2. In the configuration illustrated in FIG. 5, the second capacitor 42 occupies a relatively large area in the unit pixel cell 11. This achieves a relatively large capacitance value. In the present embodiment, the first capacitor 41 is formed so as to overlap the second capacitor 42 when viewed from the normal to the semiconductor substrate as illustrated in FIG. 5. As described later in detail, an upper electrode 41w of the first capacitor 41 is part of a wire (conductive layer) that electrically connects the source or the drain (the source/drain diffusion layer 2d) of the first reset transistor 36 and a gate electrode 34e of the amplifier transistor 34.

Figure 6:
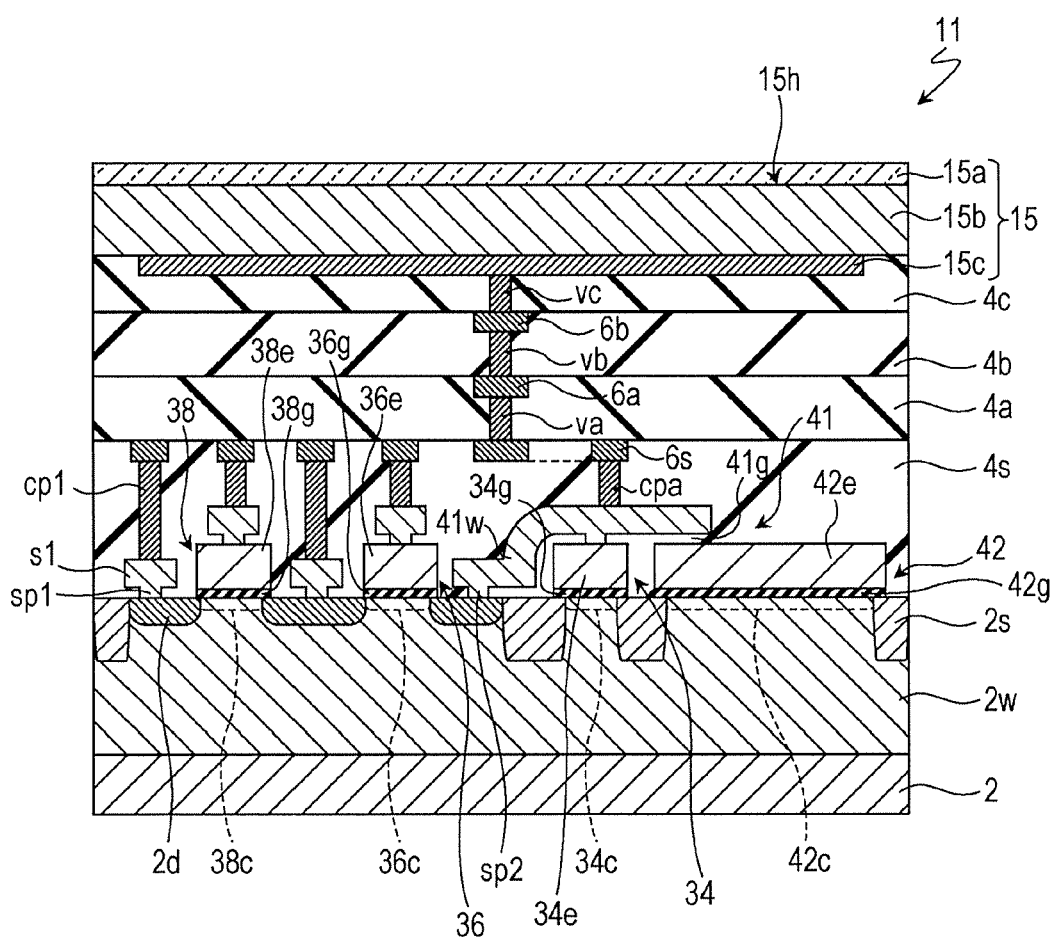
FIG. 6 is a cross-sectional view schematically illustrating a cross section taken along the line VI-VI of FIG. 5.

See FIG. 6. As illustrated in FIG. 6, the unit pixel cell 11 has the photoelectric conversion unit 15 on the semiconductor substrate 2. In the example illustrated in FIG. 6, interlayer insulating layers 4s, 4a, 4b, and 4c are staked on the semiconductor substrate 2, and the photoelectric conversion film 15b of the photoelectric conversion unit 15 is stacked on the interlayer insulating layers 4s, 4a, 4b, and 4c. The first electrode 15a is provided on the light-receiving surface 15h of the photoelectric conversion film 15b on which light from a subject is incident. The second electrode 15c is disposed on a surface opposite to the light-receiving surface 15h. The second electrodes 15c of the plurality of unit pixel cells 11 are electrically separated from one another.

In the configuration illustrated in FIG. 6, the semiconductor substrate 2 has a well 2w (a P-type impurity region in this example) having a relatively high acceptor concentration and the source/drain diffusion layers 2d (N-type impurity regions in this example). As illustrated in FIG. 6, the second reset transistor 38 includes two source/drain diffusion layers 2d, a gate insulating film 38g formed on the semiconductor substrate 2, and a gate electrode 38e formed on the gate insulating film 38g. A channel region 38c is formed between the two source/drain diffusion layers 2d that serve as the source and the drain. Similarly, the first reset transistor 36 includes two source/drain diffusion layers 2d, a gate insulating film 36g formed on the semiconductor substrate 2, and a gate electrode 36e formed on the gate insulating film 36g. A channel region 36c is formed between the two source/drain diffusion layers 2d that serve as the source and the drain. In the example illustrated in FIG. 6, the first reset transistor 36 and the second reset transistor 38 share one of the source/drain diffusion layers 2d. Similarly, the amplifier transistor 34 includes two source/drain diffusion layers 2d, a gate insulating film 34g formed on the semiconductor substrate 2, and a gate electrode 34e formed on the gate insulating film 34g. Note that in FIG. 6, the two source/drain diffusion layers 2d in the amplifier transistor 34 are not illustrated, and the gate insulating film 34g, the gate electrode 34e, and a channel region 34c formed between the two source/drain diffusion layers 2d are illustrated. The address transistor 40 (see FIG. 5) can also have a configuration similar to the amplifier transistor 34.

The semiconductor substrate 2 has the element separation region 2s for electrical separation between elements. In this example, the pair of first reset transistor 36 and second reset transistor 38 and the pair of amplifier transistor 34 and address transistor 40 are separated from each other by the element separation region 2s (see FIG. 5).

The semiconductor substrate 2 has an electrode region 42c that is surrounded by the element separation region 2s and is thus electrically separated from the four transistors (the amplifier transistor 34, the first reset transistor 36, the second reset transistor 38, and the address transistor 40) of the unit pixel cell 11.

In the configuration illustrated in FIG. 6, the second capacitor 42 includes a dielectric layer (first dielectric layer) 42g provided on the electrode region 42c and an upper electrode 42e that faces part of the semiconductor substrate 2 via the dielectric layer 42g. The upper electrode 42e is electrically connected to one of the source and drain of the first reset transistor 36 which one is not connected to the electric charge accumulation node 44.

In the present embodiment, the second capacitor 42 is a so-called MIS capacitor. However, as described later, the upper electrode 42e of the second capacitor 42 is not an electrode made of a metal but an electrode made of polysilicon. The part of the semiconductor substrate 2 that faces the upper electrode 42e functions as one of the electrodes in the second capacitor 42.

The electrode region 42c is electrically connected to the sensitivity adjustment wire 32 (see FIG. 2). A predetermined voltage is applied from a voltage source (the vertical scanning circuit 16 in this example) to the electrode region 42c via the sensitivity adjustment wire 32. The voltage of the electric charge accumulation node 44 can be controlled by controlling the voltage of the electrode region 42c. In other words, the sensitivity of the imaging device 101 can be adjusted by adjusting the voltage supplied to the electrode region 42c via the sensitivity adjustment wire 32.

Note that the shape and area of the dielectric layer 42g need not be identical to those of the electrode region 42c when viewed from the normal to the semiconductor substrate 2. The dielectric layer 42g need not cover the whole electrode region 42c. The dielectric layer 42g may also be formed on the element separation region 2s that surrounds the electrode region 42c. The electrode region 42c may be formed, for example, by ion implantation as a region having a higher impurity concentration than the well 2w. Alternatively, the electrode region 42c may be formed as a region of a conductivity type different from that of the well 2w.

As illustrated in FIG. 6, the upper electrode 41w electrically connects the source or the drain (source/drain diffusion layer 2d) of the first reset transistor 36 and the gate electrode 34e of the amplifier transistor 34. In the configuration illustrated in FIG. 6, the upper electrode 41w is electrically connected to the second electrode 15c via a contact plug cpa, a wiring layer 6s, a via va, a wiring layer 6a, a via vb, a wiring layer 6b, and a via vc. Typically, the contact plug cpa, the wiring layers 6s, 6a, and 6b, and the vias va through vc are made of a metal such as copper. The polysilicon plug sp2, the upper electrode 41w, the contact plug cpa, the wiring layers 6s, 6a, and 6b, the vias va through vc, and one of the source and drain (the drain in this example) of the first reset transistor 36 function as an electric charge accumulation region.

As illustrated in FIG. 6, the upper electrode 41w extends to a region above the upper electrode 42e of the second capacitor 42. The first capacitor 41 is formed by the upper electrode 41w, the upper electrode 42e, and an insulating film (second dielectric layer) 41g sandwiched between the upper electrode 41w and the upper electrode 42e. In other words, the first capacitor 41 includes the upper electrode 42e of the second capacitor 42, the dielectric layer 41g formed on the upper electrode 42e, and the upper electrode 41w connected to the second electrode 15c of the photoelectric conversion unit 15. At least part of the upper electrode 41w of the first capacitor 41 overlaps the upper electrode 42e via the dielectric layer 41g when viewed from the normal to the semiconductor substrate 2.

In this example, the first capacitor 41 and the second capacitor 42 share one of the two electrodes for formation of a capacitor. Note that the dielectric layer 41g can be part of the interlayer insulating layer 4s. That is, the dielectric layer 41g may be part of the interlayer insulating layer formed on the semiconductor substrate 2 or may be a separate insulating film (or insulating layer) different from the interlayer insulating layer.

The upper electrode 41w of the first capacitor 41 is made of polysilicon as with the upper electrode 42e of the second capacitor 42. A CV curve of a capacitor that has a structure in which a dielectric is sandwiched between two electrodes made of polysilicon has a flat part in a relatively wide voltage range. A voltage between the electrodes of the first capacitor 41 exhibits a relatively large fluctuation as the voltage of the electric charge accumulation node 44 changes in accordance with a light amount. Formation of the two electrodes that constitute the first capacitor 41 by using polysilicon is useful since a high-precision capacitor having a flat CV characteristic can be achieved while suppressing an increase in element size. Furthermore, as described later, an advantage of suppressing an increase in the number of steps in an imaging device production process can be obtained.

Another example of a device structure in the First Embodiment is described with reference to FIGS. 7 and 8.

Figure 7:
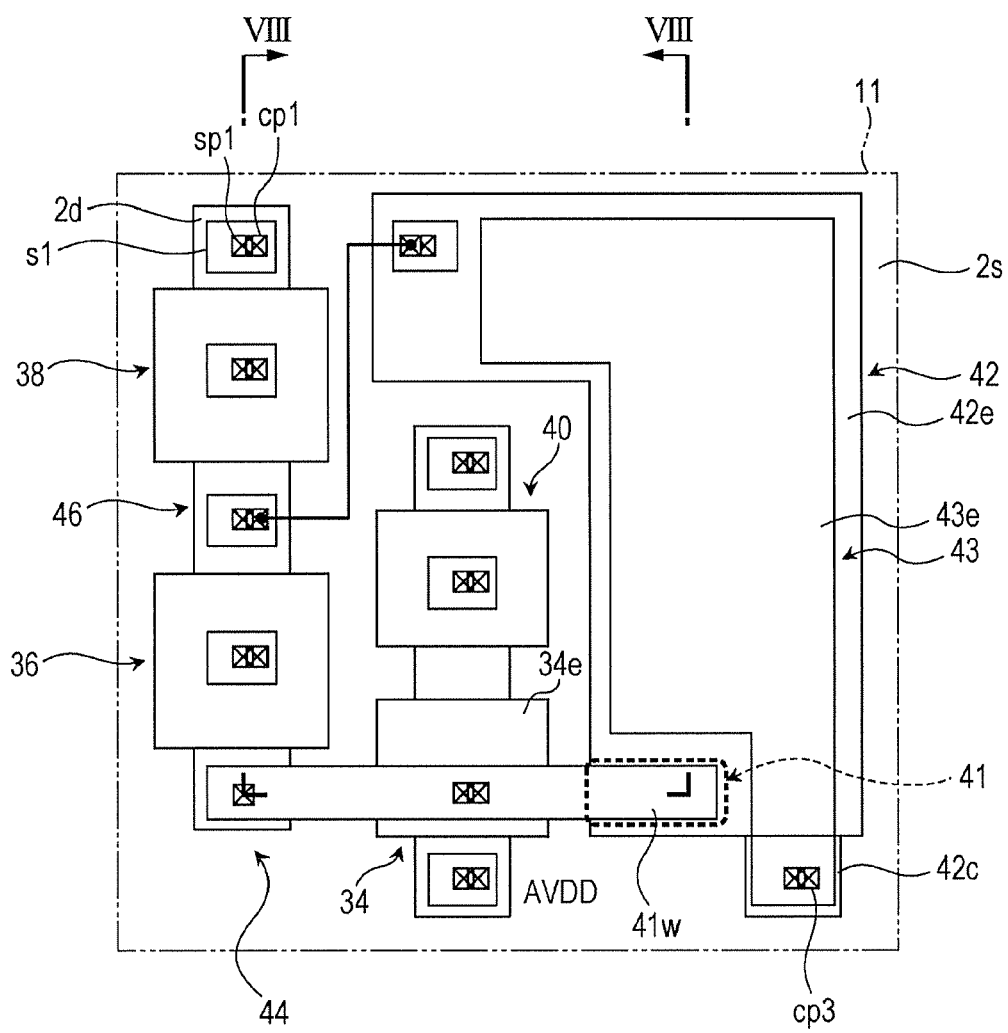
FIG. 7 is a plan view schematically illustrating another example of layout of the elements in the unit pixel cell.

FIG. 7 schematically illustrates another example of layout of the elements in the unit pixel cell 11. FIG. 8 schematically illustrates a cross section taken along the line VIII-VIII of FIG. 7. The configuration illustrated in FIGS. 7 and 8 is different from that described with reference to FIGS. 5 and 6 in that the unit pixel cell 11 illustrated in FIGS. 7 and 8 further includes a third capacitor 43.

Figure 8:
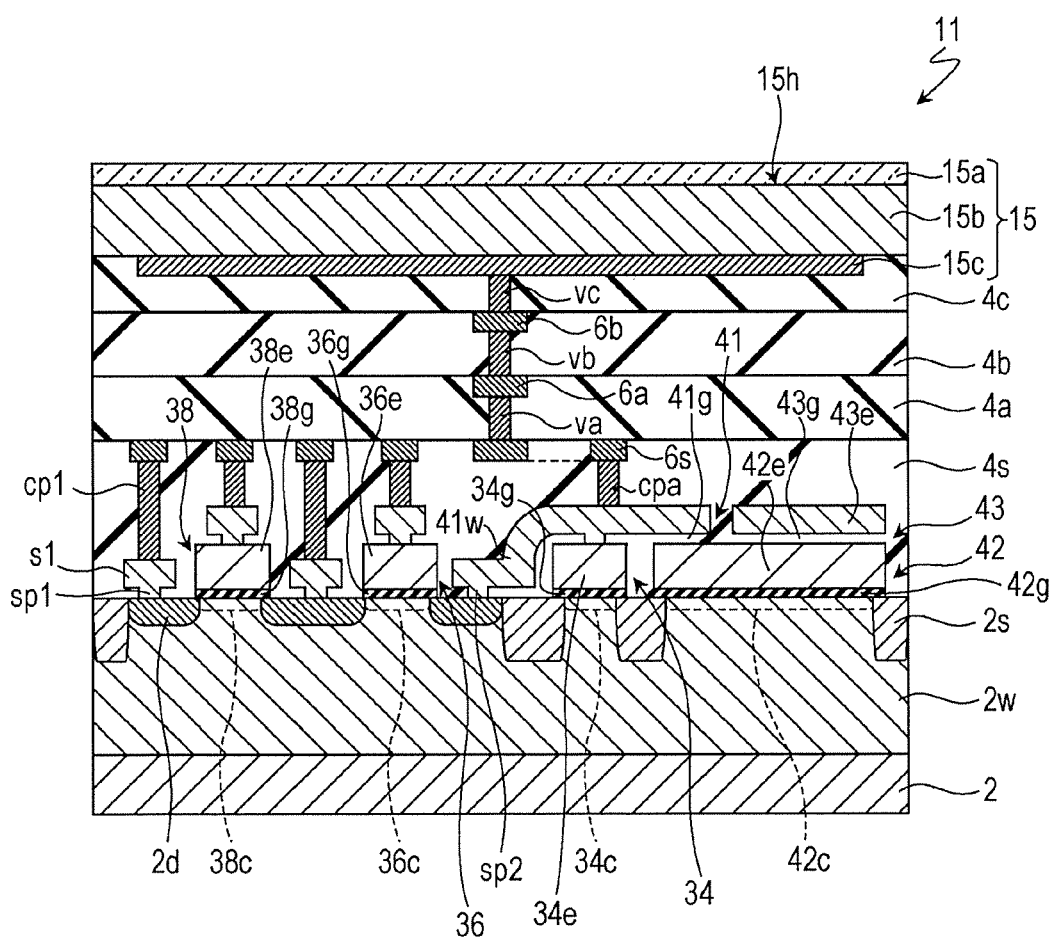
FIG. 8 is a cross-sectional view schematically illustrating a cross section taken along the line VIII-VIII of FIG. 7.

As illustrated in FIGS. 7 and 8, the third capacitor 43 includes an upper electrode 43e disposed above the upper electrode 42e of the second capacitor 42. In the configuration illustrated in FIGS. 7 and 8, the upper electrode 43e is electrically connected to the electrode region 42c of the semiconductor substrate 2, which constitutes part of the second capacitor 42, via a contact plug cp3. As described later, the upper electrode 43e of the third capacitor 43 faces the upper electrode 42e of the second capacitor 42 via the dielectric layer 43g. That is, the third capacitor 43 and the second capacitor 42 each share one of two electrodes thereof and are electrically connected in parallel with each other. It is therefore possible to increase a capacitance value of a capacitor connected between the reset drain node 46 and the sensitivity adjustment wire 32 (see FIG. 2). This makes it possible to more effectively reduce kTC noise.

Method for Producing Imaging Device 101

Figure 9:
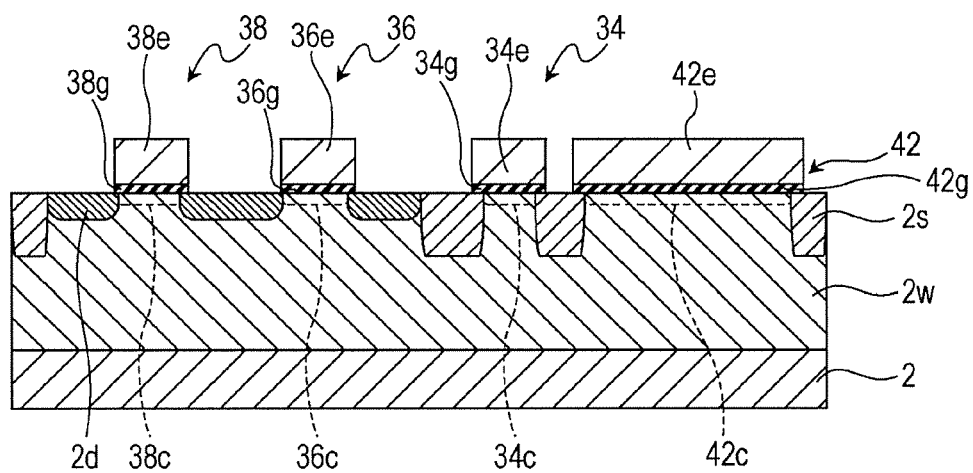
FIG. 9 is a schematic cross-sectional view for explaining an exemplary method for producing the imaging device.
Figure 10:
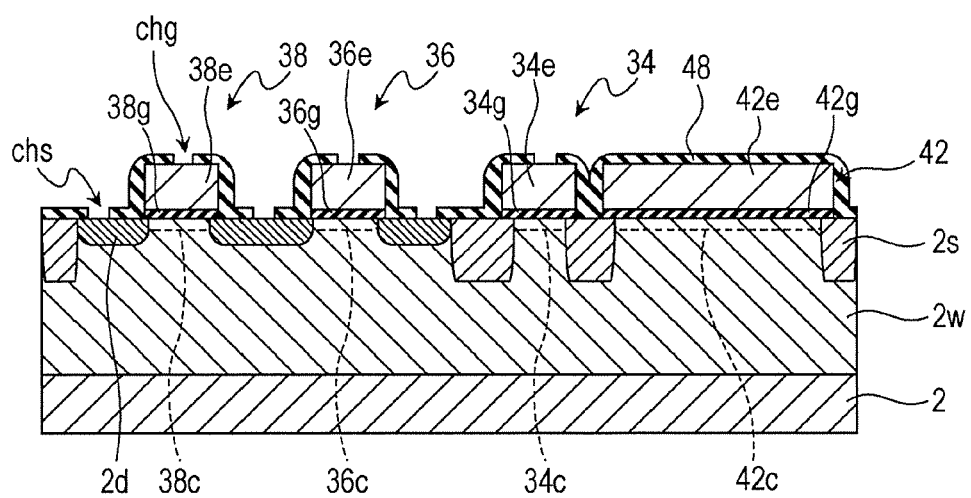
FIG. 10 is a schematic cross-sectional view for explaining an exemplary method for producing the imaging device.
Figure 11:
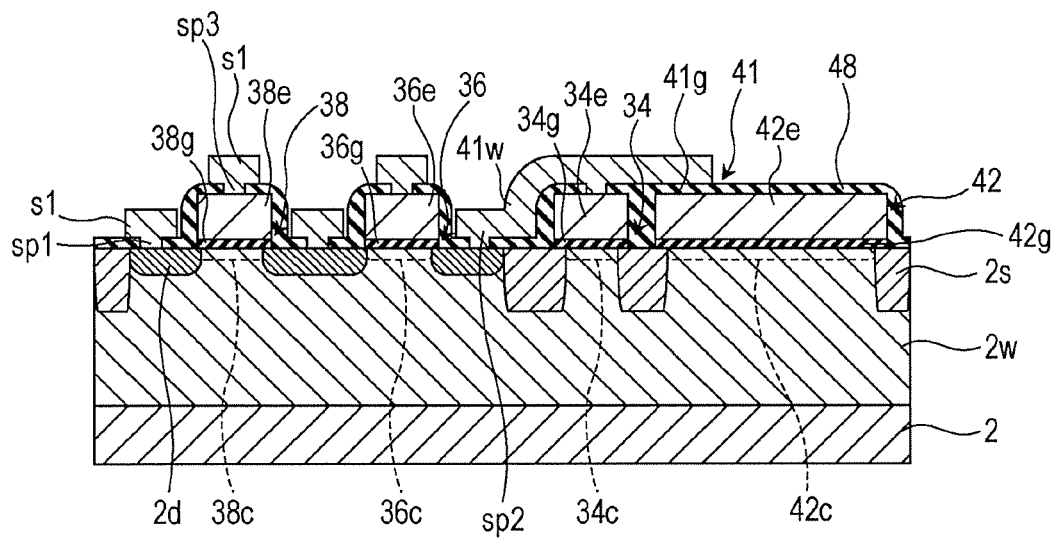
FIG. 11 is a schematic cross-sectional view for explaining an exemplary method for producing the imaging device.
Figure 12:
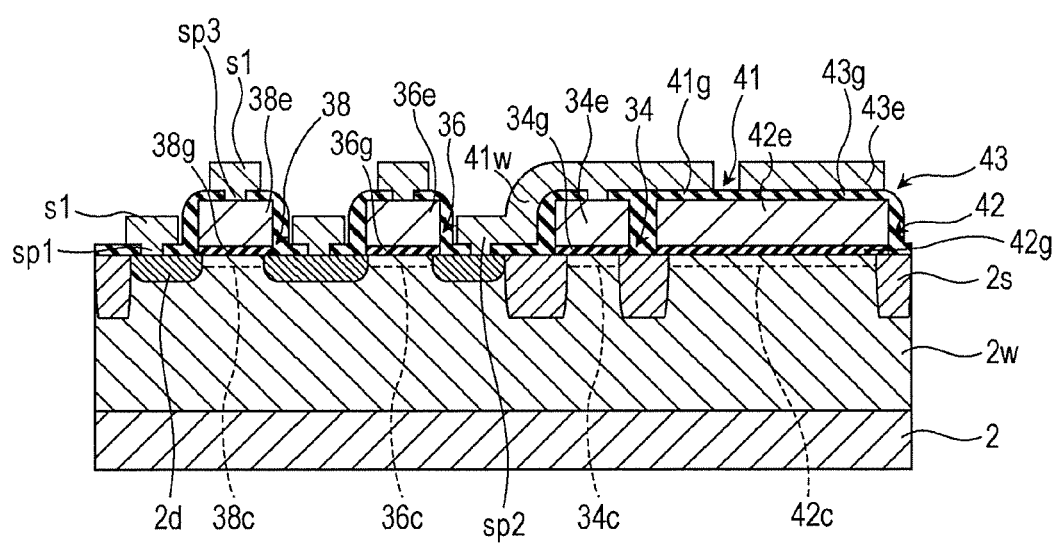
FIG. 12 is a schematic cross-sectional view for explaining an exemplary method for producing the imaging device.

Next, an example of a method for producing the imaging device 101 is described with reference to FIGS. 9 through 12. FIGS. 9 through 11 are diagrams that correspond to a cross-sectional view taken along the line VI-VI of FIG. 5. FIG. 12 is a diagram that corresponds to a cross-sectional view taken along the line VIII-VIII of FIG. 7.

First, the semiconductor substrate 2 is prepared. In this example, a P-type silicon substrate is used. Next, a mask of a resist that has been patterned is formed on the semiconductor substrate 2 by using lithography. Then, the well 2w is formed by ion implantation of an acceptor (e.g., boron (B)) under a predetermined implantation condition.

Next, a resist mask (resist pattern) for forming channel regions of transistors to be disposed in the unit pixel cell 11 is formed by using lithography. In this example, four transistors, i.e., the amplifier transistor 34, the first reset transistor 36, the second reset transistor 38, and the address transistor 40 are formed in the unit pixel cell 11. The resist mask is formed so as to cover a part other than parts that will become the channel regions of the transistors. Then, the channel regions of the transistors are formed by ion implantation of an acceptor or a donor under a predetermined implantation condition. In FIG. 9, the channel region 34c of the amplifier transistor 34, the channel region 36c of the first reset transistor 36, and the channel region 38c of the second reset transistor 38 are illustrated. A desired threshold voltage can be achieved in each transistor by using ion implantation.

In this example, a donor (e.g., arsenic (As)) is ion-implanted into a predetermined region of the semiconductor substrate 2 by using a resist mask having an opening in the predetermined region of the semiconductor substrate 2. That is, in this example, the electrode region 42c is formed by ion implantation into the predetermined region of the semiconductor substrate 2.

Next, a film of a gate oxide is formed on a main surface of the semiconductor substrate 2 by performing gate oxidation using, for example, In Situ Steam Generation (ISSG). Typically, the gate oxide is silicon dioxide ($SiO_2$). Next, a material for forming a gate electrode is deposited on the gate oxide by Chemical Vapor Deposition (CVD). In this example, a polysilicon film is formed on the gate oxide.

Next, a resist mask is formed on the polysilicon film by using lithography, and gate insulating films (the gate insulating films 34g, 36g, and 38g) and gate electrodes (the gate electrodes 34e, 36e, and 36e) are formed from the film of the gate oxide and the polysilicon film by performing dry etching, respectively. At this point in time, patterning is performed so that a multilayer of the film of the gate oxide and the polysilicon film is also formed on a region of the semiconductor substrate 2 that is different from regions in which the gate insulating films and the gate electrodes of the four transistors are formed. This can form a structure in which the first dielectric layer 42g and the upper electrode 42e are stacked on part of the semiconductor substrate 2. That is, the second capacitor 42, which is an MIS capacitor, can be formed in parallel with formation of the gate insulating films and the gate electrodes of the four transistors (see FIG. 9). According to the embodiment of the present disclosure, it is thus possible to form the second capacitor 42 in the unit pixel cell 11 without increasing the number of steps.

Next, a resist mask that covers parts that will become source regions and drain regions of the transistors is formed by using lithography. Then, the element separation region 2s is formed by ion implantation of an acceptor under a predetermined implantation condition. In the ion implantation, the acceptor for forming the element separation region 2s is not directly implanted into regions directly below the gate electrodes (the gate electrodes 34e, 36e, and 36e) of the transistors and the upper electrode 42e of the second capacitor 42. In this example, the element separation region 2s is formed so as to surround the pair of first reset transistor 36 and second reset transistor 38, the pair of amplifier transistor 34 and address transistor 40, and the second capacitor 42 (see FIG. 5). The resist mask is removed after formation of the element separation region 2s.

Next, a resist mask having an opening in the parts that will become the source regions and the drain regions of the transistors is formed by using lithography. Then, the source/drain diffusion layers 2d are formed by ion implantation of a donor under a predetermined implantation condition (see FIG. 9). The ion implantation of the donor may be performed by applying so-called gate injection to the gate electrodes of the transistors and/or the upper electrode 42e of the second capacitor 42 in the unit pixel cell 11.

Next, an insulating film that covers the polysilicon layer that constitutes the gate electrodes of the transistors and the upper electrode 42e of the second capacitor 42 and the semiconductor substrate 2 are formed by using CVD. Typically, the insulating film thus formed is a silicon dioxide film.

Next, a resist mask for formation of contact holes is formed on the insulating film that covers the polysilicon layer and the semiconductor substrate 2 by using lithography. Then, the insulating layer 48 is formed by forming contact holes chg and contact holes chs above the gate electrodes of the transistors and the source/drain diffusion layers 2d by dry etching, respectively (see FIG. 10). Note that a contact hole is also formed above the upper electrode 42e of the second capacitor 42. The contact hole above the upper electrode 42e is provided so as to electrically connect the upper electrode 42e to the reset drain node 46 (see FIG. 5).

Next, a region having a relatively high impurity concentration is formed in the gate electrodes of the transistors and the source/drain diffusion layers 2d by ion implantation of a donor via the contact holes chs and the contact holes chg formed in the insulating layer 48 (not illustrated in FIG. 10). Then, the region having a relatively high impurity concentration is caused to have low resistance by activating the implanted impurity by annealing.

Next, a film of polysilicon containing a high concentration of N-type impurity is deposited on the insulating layer 48 by a method such as CVD. The film of polysilicon is also deposited in the inside of the contact holes (the contact holes chs and chg) provided in the insulating layer 48.

Next, a resist mask is formed by using lithography. After formation of the resist mask, a polysilicon layer is formed on the insulating layer 48 by dry etching, and polysilicon plugs (the polysilicon plugs sp1 and sp2) that connect the polysilicon layer on the insulating layer 48 and the source/drain diffusion layers 2d and a polysilicon plug (the polysilicon plug sp3) that connects the polysilicon layer on the insulating layer 48 and the gate electrodes (the gate electrodes 34e, 36e, and 38e) of the transistors are formed. Note that an advantage of suppressing a dark current can be obtained since the influence of a crystal defect caused by a metal/semiconductor interface in the case of use of metal plugs can be avoided by using the plugs made of polysilicon as contacts with the source/drain diffusion layers 2d that constitute part of the electric charge accumulation node 44 (see, for example, FIG. 5). Then, a polysilicon layer s1 serving as a conductive layer is formed by lowering the resistance of the surface of the polysilicon layer on the insulating layer 48 by silicidation (see FIG. 11).

At this point in time, a conductive part (a polysilicon wire) that connects the source or the drain of the first reset transistor 36 and the gate electrode 34e of the amplifier transistor 34 is formed by patterning of polysilicon. The patterning is performed so that at least part of this conductive part overlaps the upper electrode 42e of the second capacitor 42 via the insulating layer 48. This makes it possible to form the first capacitor 41 having a structure in which an insulating film is sandwiched between two polysilicon layers. As is clear from the above description, the upper electrode 41w of the first capacitor 41 can be part of the polysilicon layer s1. Furthermore, the second dielectric layer 41g of the first capacitor 41 can be part of the insulating layer 48. According to the First Embodiment of the present disclosure, it is possible to form the first capacitor 41 in the unit pixel cell 11 without increasing the number of steps.

As illustrated in FIG. 12, the patterning of polysilicon may be performed so that a conductive part different from the upper electrode 41w is formed so as to overlap the upper electrode 42e of the second capacitor 42. By electrically connecting this conductive part and the electrode region 42c of the semiconductor substrate 2, it is possible to cause this conductive part to function as the upper electrode 43e of the third capacitor 43. The dielectric layer 43g of the third capacitor 43 can be part of the insulating layer 48 as with the second dielectric layer 41g of the first capacitor 41. According to the embodiment of the present disclosure, it is thus possible to form, in the unit pixel cell 11, the third capacitor 43 that exhibits a flat CV characteristic in a relatively wide voltage range without adding a special step. Furthermore, it is possible to increase the composite capacitance of the second capacitor 42 and the third capacitor 43 while suppressing an increase in pixel size.

After formation of the polysilicon layer s1, the interlayer insulating layer 4s, the contact plug cpa for connection between the wiring layer 6s and the upper electrode 41w, the wiring layer 6s, the interlayer insulating layer 4a, the via va, the wiring layer 6a, the interlayer insulating layer 4b, the via vb, the wiring layer 6b, the interlayer insulating layer 4c, and the via vc are sequentially formed. Note that the number of interlayer insulating layers and the like can be any number and need not be four layers. The unit pixel cell 11 illustrated in FIG. 6 or FIG. 8 is obtained by forming the photoelectric conversion unit 15 on the interlayer insulating layer 4c.

As described above, the imaging device 101 can be produced by using a known semiconductor production technique. A camera system can be realized by the imaging device 101 thus obtained and an optical system that forms an image on the light-receiving surface 15h of the photoelectric conversion film 15b. A protective film, a color filter, a lens (microlens), and the like may be further formed on the first electrode 15a of the photoelectric conversion unit 15.

Modification of First Embodiment

A modification of the imaging device according to the First Embodiment of the present disclosure is described with reference to FIG. 13.

Figure 13:
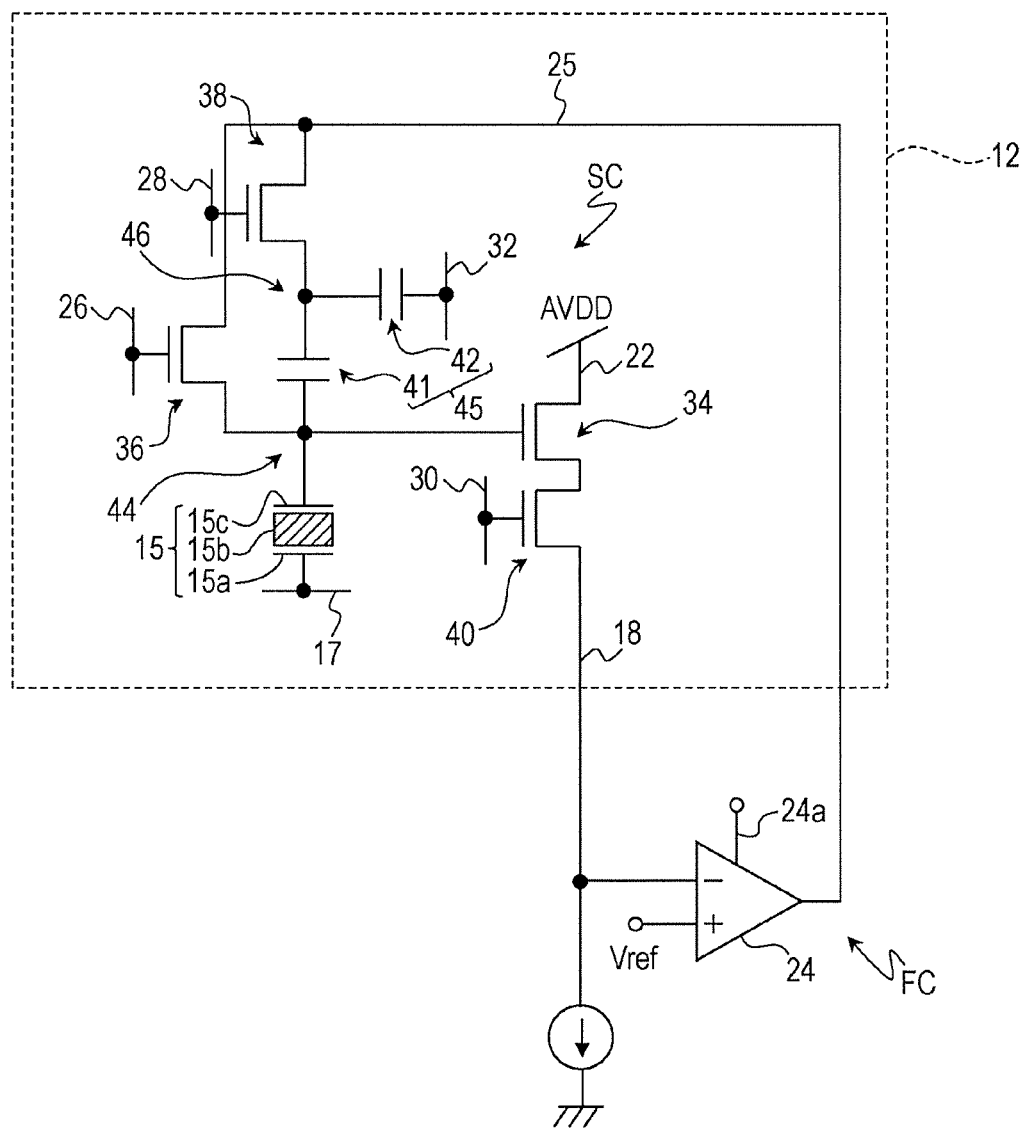
FIG. 13 is a schematic view illustrating another exemplary circuit configuration of the unit pixel cell in the imaging device according to the First Embodiment.

FIG. 13 schematically illustrates an exemplary circuit configuration of a unit pixel cell 12 in the imaging device according to the First Embodiment. The configuration illustrated in FIG. 13 is different from the configuration illustrated in FIG. 2 in that one of a source and a drain of a first reset transistor 36 which one is not connected to a second electrode 15c (electric charge accumulation node 44) is connected not to a reset drain node 46 but to a feedback wire 25.

In the configuration illustrated in FIG. 13, switching between the first mode and the second mode described with reference to FIGS. 3 and 4 cannot be performed. However, since the one of the source and drain of the first reset transistor 36 which one is not connected to the electric charge accumulation node 44 is directly connected to the feedback wire 25, an advantage of improving flexibility of design of an impurity profile for securing driving force of the first reset transistor 36 is obtained. Note that operation timings of each transistor in the configuration illustrated in FIG. 13 are similar to those in the first mode described above.

In the configuration described with reference to FIG. 2, one of the electrodes of the first capacitor 41 is directly connected to one of the source and drain of the first reset transistor 36, and the other of the electrodes of the first capacitor 41 is directly connected to the other of the source and the drain of the first reset transistor 36. However, as illustrated in FIG. 13, the first reset transistor 36 need not necessarily connected to the first capacitor 41 in parallel with each other.

Layout and a device structure of elements in the unit pixel cell 12 illustrated in FIG. 13 are almost similar to the layout described with reference to FIGS. 5 and 7 and the device structure described with reference to FIGS. 6 and 8, and therefore description thereof is omitted. A method for producing the unit pixel cell 12 illustrated in FIG. 13 can be similar to that described with reference to FIGS. 9 through 12.

Second Embodiment

Figure 14:
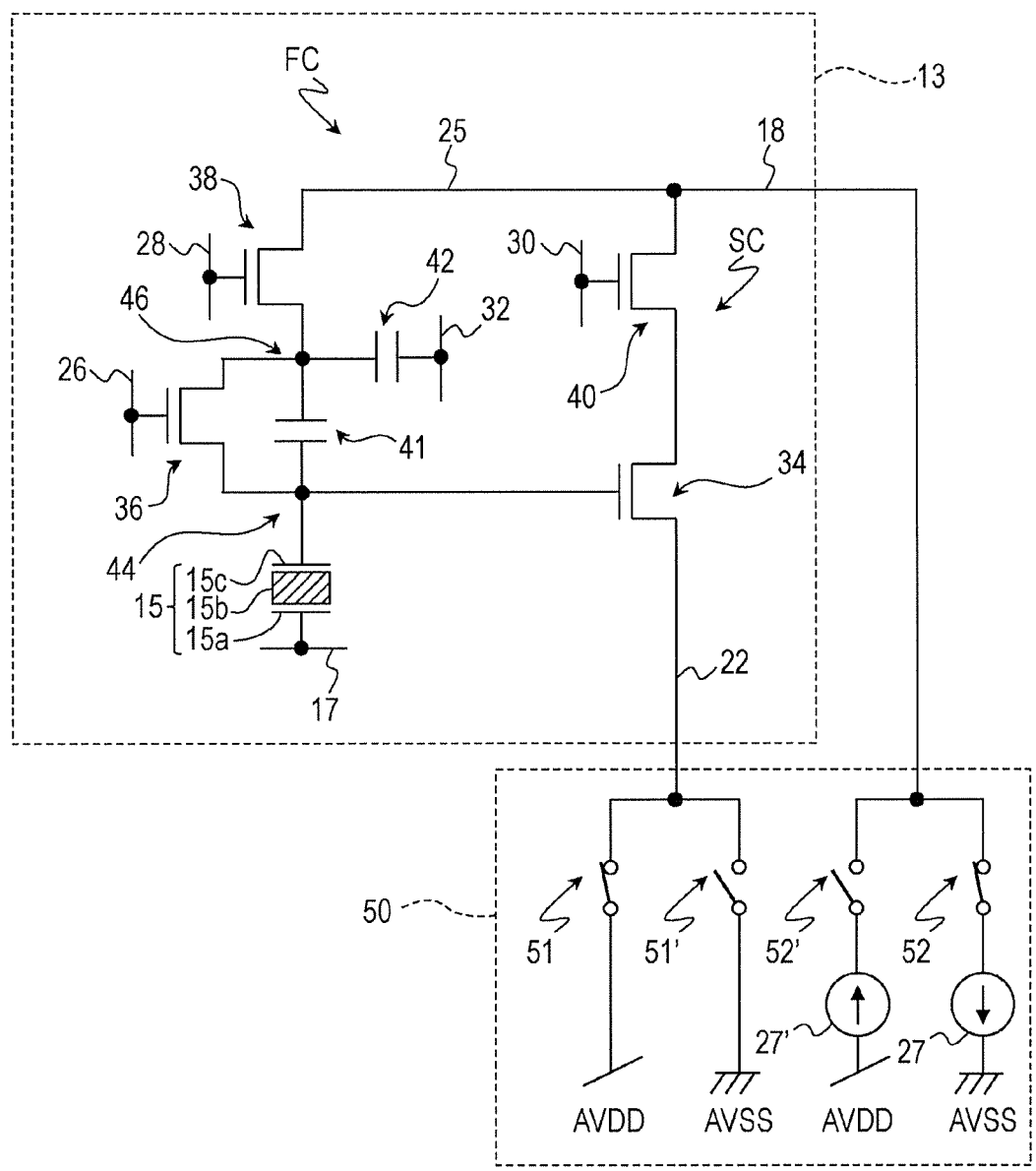
FIG. 14 is a schematic view illustrating an exemplary circuit configuration of a unit pixel cell in an imaging device according to the Second Embodiment.

FIG. 14 schematically illustrates an exemplary circuit configuration of a unit pixel cell 13 in an imaging device according to the Second Embodiment. As illustrated in FIG. 14, the imaging device according to the Second Embodiment is different from the imaging device 101 according to the First Embodiment in that a switching circuit 50 is provided in each column of unit pixel cells 13 instead of the inverting amplifier 24 (see FIGS. 2 and 13). Accordingly, a feedback wire 25 does not connect a plurality of unit pixel cells 13 that constitute each column of the imaging device according to the Second Embodiment.

In each of the unit pixel cells 13, the feedback wire 25 is connected to one of a source and a drain of a second reset transistor 38 which one is not connected to a reset drain node 46. An address transistor 40 is provided between one of a source and a drain of an amplifier transistor 34 and the feedback wire 25. One of a source and a drain of the address transistor 40 which one is connected to the feedback wire 25 is connected to a vertical signal wire 18. Differences from the imaging device 101 according to the First Embodiment are mainly described below.

The switching circuit 50 includes switch elements 51 and 51' that are connected to a power source wire 22 in parallel with each other and switch elements 52' and 52 that are connected to a vertical signal wire 18 in parallel with each other. The switch elements 51 and 51' are connected to a power source voltage (AVDD) and a reference voltage (AVSS), respectively. The switch elements 52' and 52 are connected to the power source voltage (AVDD) and the reference voltage (AVSS) via constant current sources 27' and 27, respectively.

At the time of readout of a signal in the unit pixel cells 13, one of the unit pixel cells 13 of each column is selected by applying a voltage to the gate of the address transistor 40 via an address signal wire 30. Furthermore, by turning the switch element 51 and the switch element 52 of the switching circuit 50 ON, an electric current flows from the constant current source 27, for example, in a direction from the amplifier transistor 34 toward the address transistor 40, and an voltage of the electric charge accumulation node 44 amplified by the amplifier transistor 34 is detected.

Meanwhile, in a reset operation, by turning the switch element 51' and the switch element 52' of the switching circuit 50 ON, an electric current flows in the address transistor 40 and the amplifier transistor 34 in a direction opposite to that at a time of a signal readout. This forms a feedback circuit FC including the amplifier transistor 34, the address transistor 40, the feedback wire 25, the second reset transistor 38, and a first reset transistor 36. In this case, the address transistor 40 and the amplifier transistor 34 are cascode-connected, and therefore large gain can be obtained. This allows the feedback circuit FC to perform noise cancelling with large gain.

The imaging device according to the present embodiment can be operated in a first mode in which imaging with relatively high sensitivity is possible and a second mode in which imaging with relatively low sensitivity is possible by controlling the first reset transistor 36 and the second reset transistor 38, as in the imaging device according to the First Embodiment. Furthermore, according to the imaging device of the present embodiment, it is possible to reduce kTC noise as in the First Embodiment.

The imaging device of the present embodiment does not include the inverting amplifier 24, and the address transistor 40 and the amplifier transistor 34 serve as amplifiers of a signal detection circuit SC and a feedback circuit FC. It is therefore possible to reduce the area of circuits of the imaging device. Furthermore, it is possible to reduce power consumption of the imaging device. Furthermore, since large gain can be obtained by cascode connection, kTC noise can be reduced even in a case where the capacitance of the first capacitor 41 and the capacitance of the second capacitor 42 are small.

Layout of elements in the unit pixel cell 13 illustrated in FIG. 14 can be almost similar to that in the unit pixel cell 11 described with reference to FIGS. 5 and 7. A device structure of the elements in the unit pixel cell 13 can be almost similar to that in the unit pixel cell 11 described with reference to FIGS. 6 and 8. Therefore, description of the layout and device structure of the elements in the unit pixel cell 13 is omitted. A method for producing the unit pixel cell 13 can be similar to the method for producing the unit pixel cell 11 described with reference to FIGS. 9 through 12. Therefore, description of the method for producing the unit pixel cell 13 is omitted.

Third Embodiment

Figure 15:
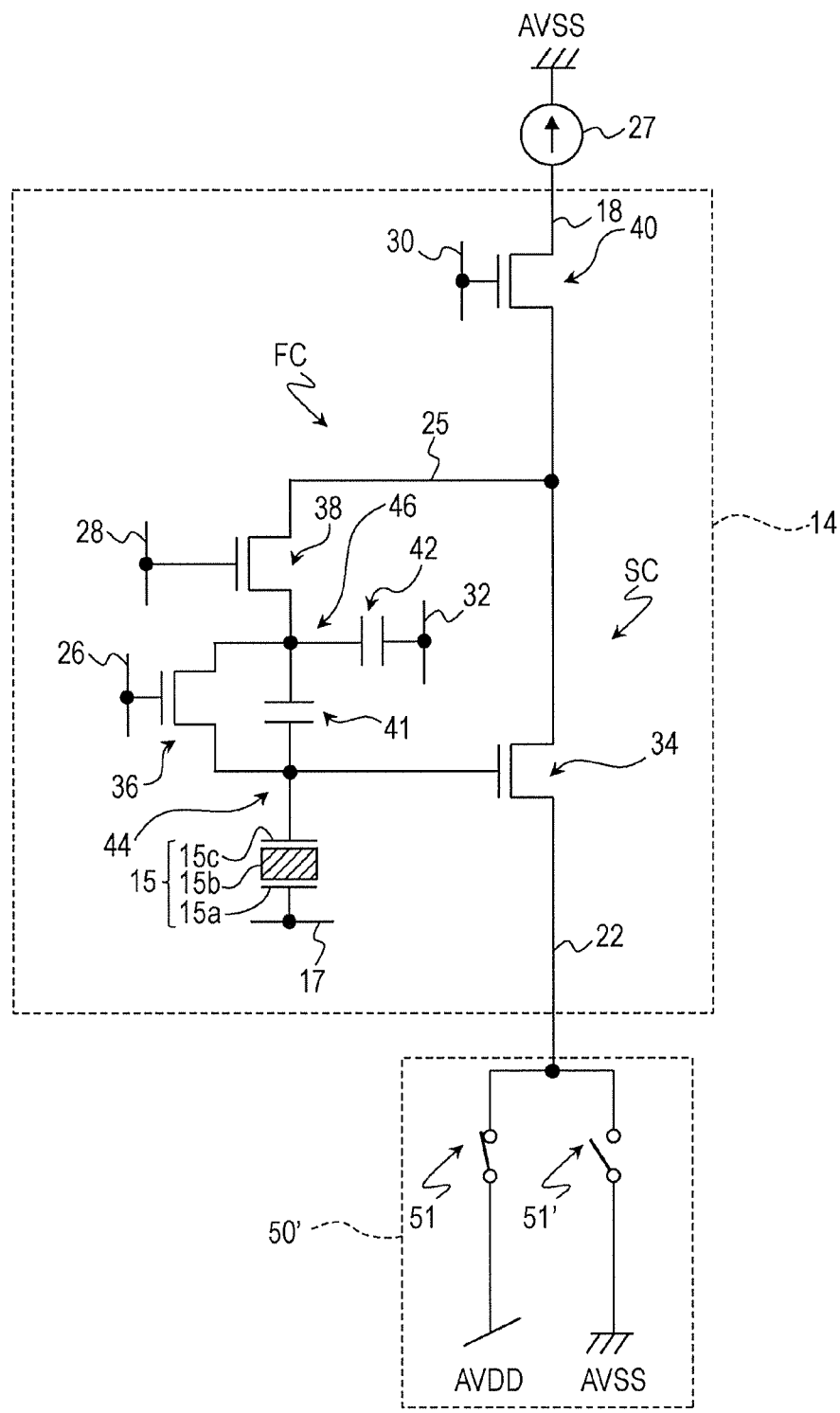
FIG. 15 is a schematic view illustrating an exemplary circuit configuration of a unit pixel cell in an imaging device according to the Third Embodiment.

FIG. 15 illustrates an exemplary circuit configuration of a unit pixel cell 14 in an imaging device according to the Third Embodiment. As in the Second Embodiment, the imaging device according to the Third Embodiment is different from the imaging device 101 according to the First Embodiment in that a switching circuit 50' is provided in each column of unit pixel cells 14 instead of the inverting amplifier 24 (see FIGS. 2 and 13). Furthermore, a feedback wire 25 does not connect a plurality of unit pixel cells 14 of each column.

In each of the unit pixel cells 14, the feedback wire 25 is connected to one of a source and a drain of a second reset transistor 38 which one is not connected to a reset drain node 46. One of a source and a drain of an address transistor 40 is connected to a constant current source 27 via a vertical signal wire 18. The other of the source and the drain of the address transistor 40 is connected to the feedback wire 25 and one of a source and a drain of an amplifier transistor 34. The other of the source and the drain of the amplifier transistor 34 is connected to the switching circuit 50' via a power source wire 22.

The switching circuit 50' includes switch elements 51 and 51' that are connected in parallel with each other, and the switch elements 51 and 51' are connected to a power source voltage (AVDD) and a reference voltage (AVSS), respectively.

The imaging device according to the present embodiment can also be operated in a first mode in which imaging with relatively high sensitivity is possible and a second mode in which imaging with relatively low sensitivity is possible, as in the imaging device 101 according to the First Embodiment.

Figure 16:
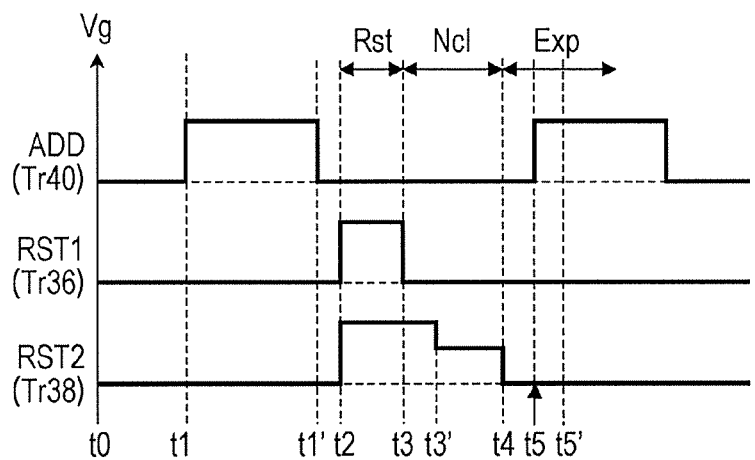
FIG. 16 is a timing diagram for explaining an example of operation of transistors in a first mode in the imaging device according to the Third Embodiment.

FIG. 16 is a timing diagram for explaining an example of operation of the transistors in the first mode. In FIG. 16, ADD, RST1, and RST2 schematically illustrate examples of changes of a gate voltage of the address transistor 40, a gate voltage of the first reset transistor 36, and a gate voltage of the second reset transistor 38, respectively. In the example illustrated in FIG. 16, at a time t0, the address transistor 40, the first reset transistor 36, and the second reset transistor 38 are OFF. For simplification, description of operation of an electronic shutter is omitted.

First, the address transistor 40 is turned ON (a time t1) by controlling the voltage of an address signal wire 30. At this point in time, a signal electric charge accumulated in an electric charge accumulation node 44 is read out.

Next, the address transistor 40 is turned OFF (a time t1'). Then, the first reset transistor 36 and the second reset transistor 38 are turned ON (a time t2) by controlling the voltage of a reset signal wire 26 and the voltage of a feedback control wire 28. Furthermore, a reference voltage (AVSS) is applied to one of the source and drain of the amplifier transistor 34 by controlling the switching circuit 50'. At this point in time, the address transistor 40 maintains an OFF state. This causes the electric charge accumulation node 44 and the feedback wire 25 to be connected to each other via the first reset transistor 36 and the second reset transistor 38 in the unit pixel cell 14, thereby forming a feedback circuit FC that negatively feeds back output of a signal detection circuit SC including the amplifier transistor 34.

At a time t3, the first reset transistor 36 is turned OFF (the time t3). When the first reset transistor 36 is turned OFF at the time t3, kTC noise occurs. Accordingly, the kTC noise is added to the voltage of the electric charge accumulation node 44 after reset. The kTC noise that occurs when the first reset transistor 36 is turned OFF is cancelled down to $1/(1+A)$ where A is gain of the feedback circuit FC. Noise can be suppressed fast by setting the voltage of the feedback control wire 28 so that the operation band of the second reset transistor 38 becomes a first band which is a broad band. It should be noted that a frequency band of a signal passing between a source and a drain of a transistor is referred to as an operation band of the transistor.

Then, at a time t3', the voltage of the feedback control wire 28 is set to an intermediate voltage between a high level and a low level. This causes the operation band of the second reset transistor 38 to become a second band narrower than the first band.

At a time t4, the second reset transistor 38 is turned OFF, and thereby kTC noise occurs. Accordingly, the kTC noise is further added to the voltage of the electric charge accumulation node 44 after reset. The kTC noise that occurs is suppressed by the feedback circuit FC and is cancelled down to $1/(1+A)^{1/2}$ in a state where the second band is lower than the operation band of the amplifier transistor 34.

Next, at a time t5, the address transistor 40 is turned ON. Furthermore, one of the source and drain of the amplifier transistor 34 is connected to the power source voltage (AVDD) by controlling the switching circuit 50'. This causes an electric current to flow from the constant current source 27, for example, in a direction from the amplifier transistor 34 toward the address transistor 40, and the voltage of the electric charge accumulation node 44 amplified by the amplifier transistor 34 is detected. The detected voltage is supplied to the constant current source 27 (the column signal processing circuit 20, see FIG. 1) via the vertical signal wire 18. In FIG. 16, a period of exposure is schematically indicated by the arrow Exp. During the period of exposure, a reset voltage in which the kTC noise has been cancelled is read out at a predetermined timing (a time t5'). Note that since a period of time taken to read out the reset voltage is short, readout of the reset voltage may be performed while the ON state of the address transistor 40 continues.

A signal from which fixed noise has been removed is obtained by calculating a difference between a signal read out during a period between the time t1 and the time t1' and a signal read out at the time t5'. In this way, a signal from which the kTC noise and the fixed noise have been removed is obtained.

Figure 17:
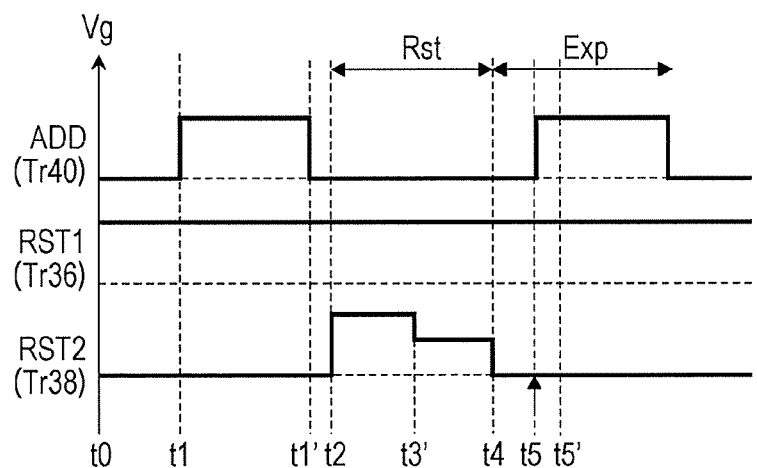
FIG. 17 is a timing diagram for explaining an example of operation of transistors in a second mode in the imaging device according to the Third Embodiment.

FIG. 17 is a timing diagram for explaining an example of operation of the transistors in the second mode in which imaging with relatively low sensitivity is possible. As described in the First Embodiment, the transistors are driven in the same manner as in the first mode except for that the first reset transistor 36 is always ON, and kTC noise is suppressed by a feedback circuit in each unit pixel cell 14.

In the imaging device according to the present embodiment, the first reset transistor 36 has both a function of a reset transistor that resets the electric charge accumulation node 44 and a function of a switch that switches between the first mode and the second mode, as in the First Embodiment. Furthermore, the second capacitor 42 has both a function of reducing kTC noise in the first mode and a function of increasing the capacitance value of the entire electric charge accumulation region. According to the present embodiment, it is possible to expand a dynamic range with a simple configuration while suppressing an increase in the number of elements in a pixel. This is useful especially for miniaturization of pixels.

Modification of Third Embodiment

Figure 18:
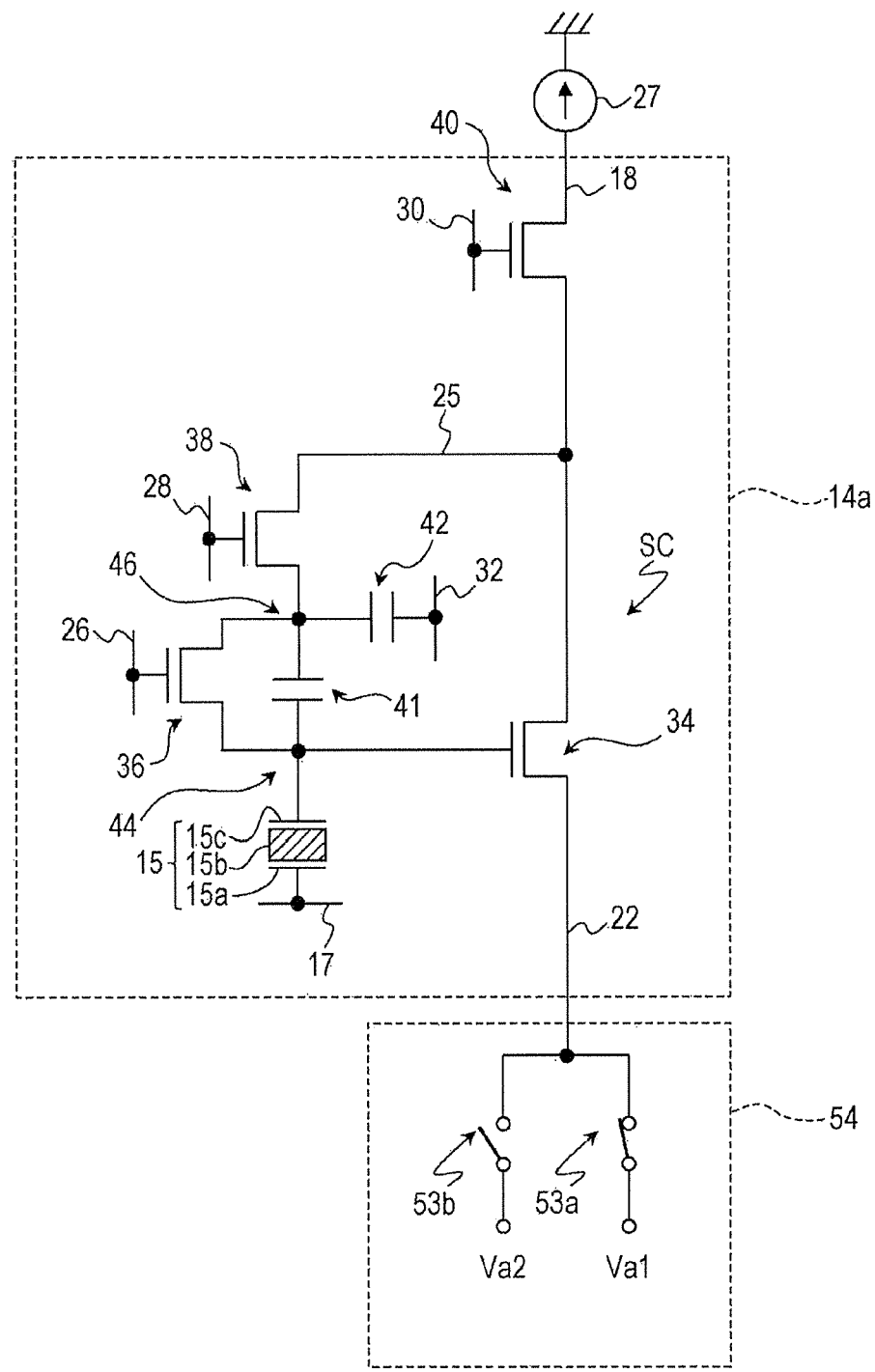
FIG. 18 is a schematic view illustrating an exemplary circuit configuration of a unit pixel cell in an imaging device according to a modification of the Third Embodiment.

FIG. 18 schematically illustrates an exemplary circuit configuration of a unit pixel cell 14a in an imaging device according to a modification of the Third Embodiment. As illustrated in FIG. 18, also in this example, the inverting amplifier 24 (see FIGS. 2 and 13) is omitted, and a feedback wire 25 connects one of a source and a drain of a second reset transistor 38 which one is not connected to a reset drain node 46 and one of a source and a drain of an amplifier transistor 34. In the configuration illustrated in FIG. 18, output of an amplifier transistor 34 is used as a reference voltage at reset.

In the configuration illustrated in FIG. 18, a voltage switching circuit 54 is connected to a power source wire 22. The voltage switching circuit 54 has a pair of first switch 53a and second switch 53b. The voltage switching circuit 54 switches whether to supply a first voltage Va1 to the power source wire 22 or to supply a second voltage Va2 to the power source wire 22. The first voltage Va1 is, for example, 0 V (grounding), and the second voltage Va2 is, for example, a power source voltage. The voltage switching circuit 54 may be provided for each pixel or may be shared by a plurality of pixels.

According to such a circuit configuration, kTC noise can be reduced as in the First Embodiment.

Figure 19:
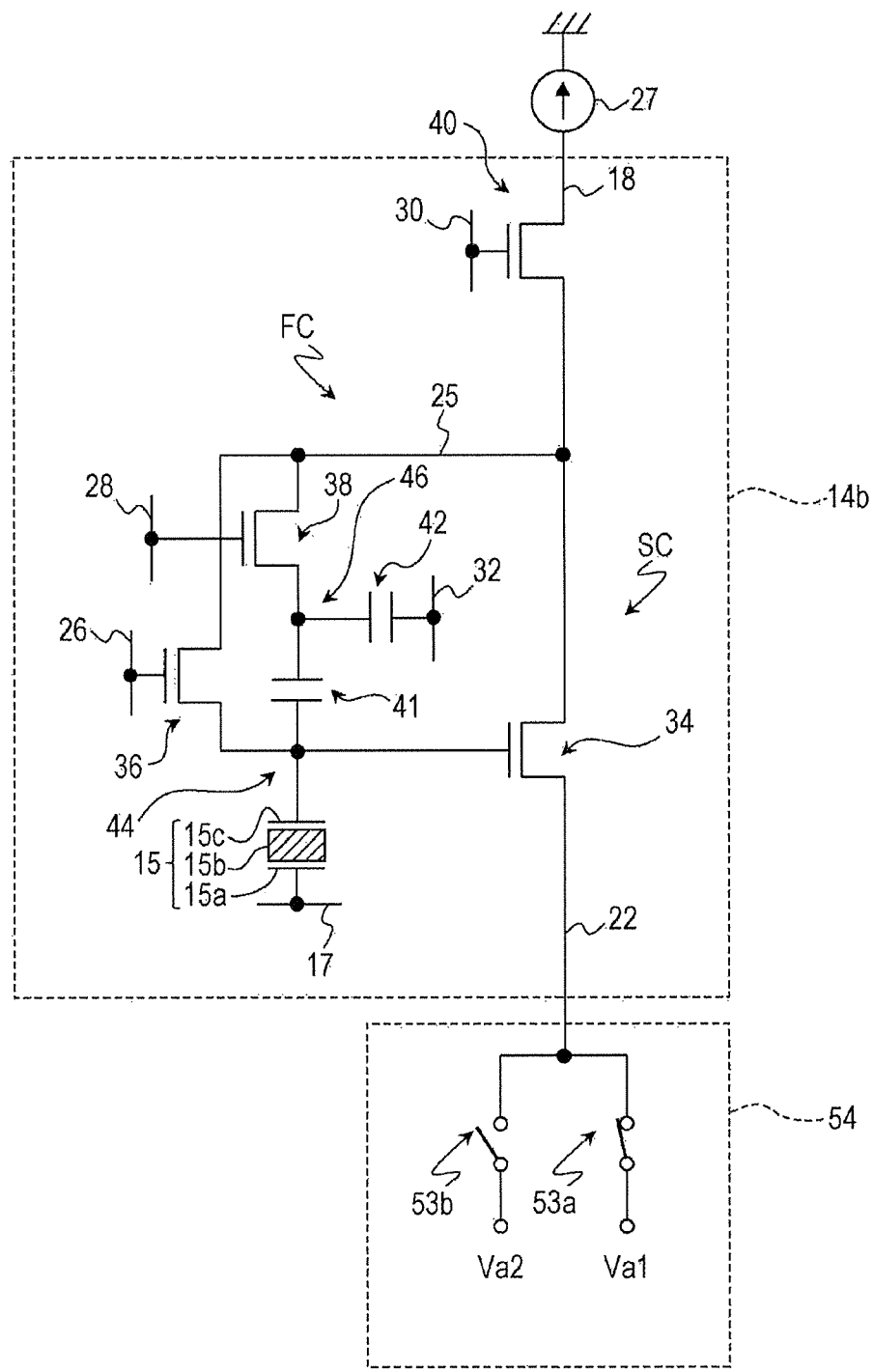
FIG. 19 is a schematic view illustrating an exemplary circuit configuration of a unit pixel cell in an imaging device according to another modification of the Third Embodiment.

FIG. 19 schematically illustrates an exemplary circuit configuration of a unit pixel cell 14b in an imaging device according to another modification of the Third Embodiment. In the configuration illustrated in FIG. 19, one of a source and a drain of a first reset transistor 36 which one is not connected to an electric charge accumulation node 44 is connected not to a reset drain node 46 but to a feedback wire 25, as in the circuit configuration described with reference to FIG. 13. According to such a circuit configuration, kTC noise can be reduced as in the First Embodiment.

Layout of the elements in the unit pixel cell 14 illustrated in FIG. 15, the unit pixel cell 14a illustrated in FIG. 18, and the unit pixel cell 14b illustrated in FIG. 19 can be almost similar to that in the unit pixel cell 11 described with reference to FIGS. 5 and 7. Furthermore, a device structure of the elements in the unit pixel cells 14, 14a, and 14b can be almost similar to that in the unit pixel cell 11 described with reference to FIGS. 6 and 8. Therefore, description of the layout and the device structure of the elements in the unit pixel cells 14, 14a, and 14b is omitted. A method for producing the unit pixel cell 14 illustrated in FIG. 15, the unit pixel cell 14a illustrated in FIG. 18, and the unit pixel cell 14b illustrated in FIG. 19 can be similar to the method for producing the unit pixel cell 11 described with reference to FIGS. 9 through 12. Therefore, description of the method for producing the unit pixel cells 14, 14a, and 14b is omitted.

Fourth Embodiment

In the embodiments above, the electrode region 42c is provided in the semiconductor substrate 2, and the second capacitor 42 is a so-called MIS capacitor. However, the configuration of a high-capacitance capacitor in the signal detection circuit SC is not limited to the above example. As described below, a capacitor that has a structure in which a dielectric is sandwiched between two electrodes made of a metal or a metal compound may be disposed in an interlayer insulating layer provided between the semiconductor substrate 2 and the photoelectric conversion unit 15. Hereinafter, the structure in which a dielectric is sandwiched between two electrodes made of a metal or a metal compound is sometimes referred to as a "MIM (Metal-Insulator-Metal) structure". By forming, as a capacitor having a so-called MIM structure, In a case where a capacitor disposed in an interlayer insulating layer between the semiconductor substrate 2 and the photoelectric conversion unit 15 has a so-called MIM structure, it is easier to obtain a larger capacitance value. The device structure described below is applicable to any of the First through Third Embodiments described above.

Figure 20:
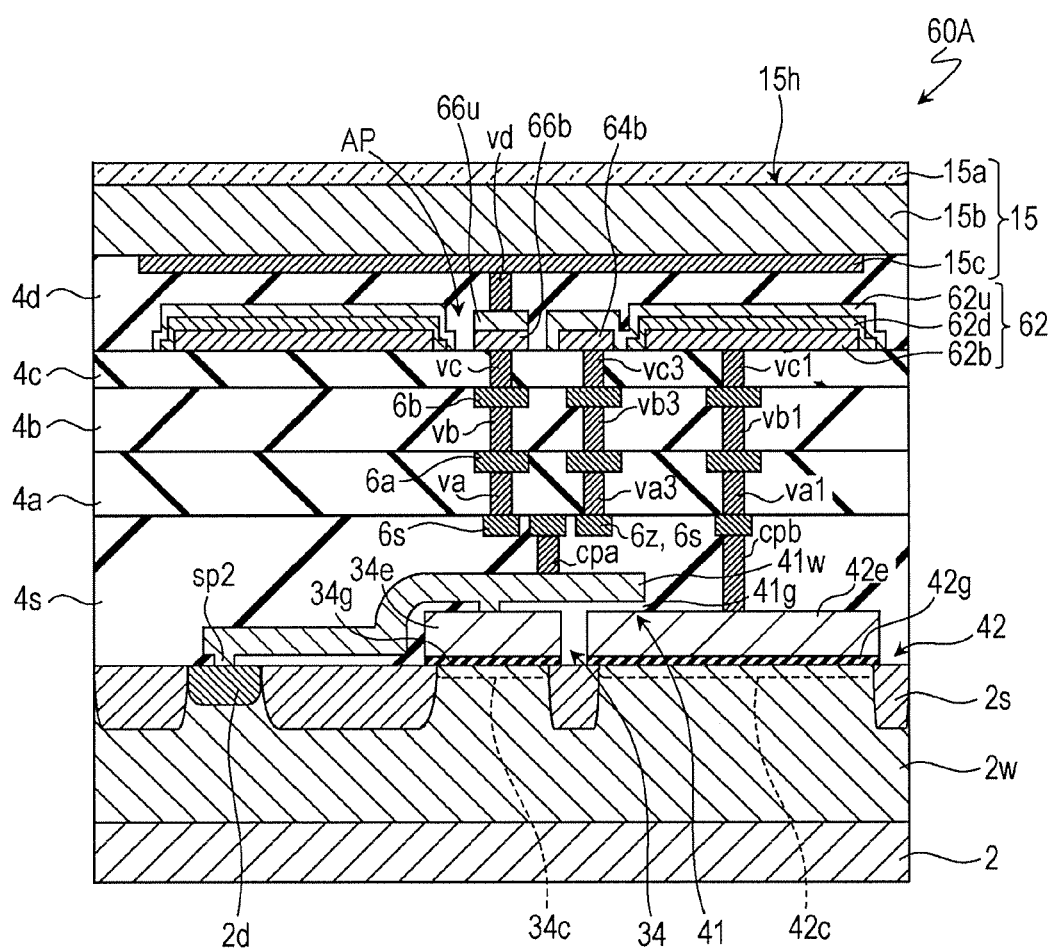
FIG. 20 is a schematic cross-sectional view illustrating an example of a device structure of a unit pixel cell in an imaging device according to the Fourth Embodiment.

FIG. 20 schematically illustrates another example of a device structure of a unit pixel cell. Layout of elements on a semiconductor substrate 2 in a unit pixel cell 60A illustrated in FIG. 20 can be similar to that in the unit pixel cell 11 illustrated in FIG. 5. FIG. 20 is a diagram corresponding to a cross-sectional view taken along the line XX-XX of FIG. 5.

The unit pixel cell 60A illustrated in FIG. 20 has a capacitor 62 disposed between a semiconductor substrate 2 and a second electrode 15c. The capacitor 62 includes an upper electrode 62u, a lower electrode 62b, and a dielectric layer 62d disposed between the upper electrode 62u and the lower electrode 62b. As illustrated in FIG. 20, the lower electrode 62b is disposed farther from the second electrode 15c than the upper electrode 62u is (i.e., nearer to the semiconductor substrate 2 than the upper electrode 62u is). Note that terms "upper" and "lower" used herein are used to show relative positions of members and do not limit the posture of the imaging device of the present disclosure.

In this example, the lower electrode 62b is formed on an interlayer insulating layer 4c, and the capacitor 62 is covered with an interlayer insulating layer 4d provided between the interlayer insulating layer 4c and a photoelectric conversion film 15b. By thus disposing the lower electrode 62b and the upper electrode 62u between the photoelectric conversion unit 15 and a gate electrode 34e of an amplifier transistor 34, it is possible to suppress interference between (i) a wiring layer including the gate electrode 34e of the amplifier transistor 34 and (ii) the lower electrode 62b and the upper electrode 62u. It is therefore possible to form the capacitor 62 having a relatively large electrode area.

The lower electrode 62b is typically a metal electrode or a metal nitride electrode. Examples of a material of which the lower electrode 62b is made is Ti, TiN, Ta, TaN, Mo, Ru, and Pt. The lower electrode 62b may be part of the wiring layer provided in the interlayer insulating layer 4d.

The dielectric layer 62d is stacked on the lower electrode 62b. In this example, the dielectric layer 62d covers a surface of the lower electrode 62b that faces the second electrode 15c and side surfaces of the lower electrode 62b.

The dielectric layer 62d may be made of a material (e.g., a metal oxide or a metal nitride) different from a material (typically silicon dioxide) of which the interlayer insulating layer 4d is made. In a case where the capacitor 62 is disposed in the interlayer insulating layer provided between the semiconductor substrate 2 and the photoelectric conversion unit 15, it is relatively easy to use a material having a relatively high permittivity as a material of which the dielectric layer 62d is made. It is therefore easy to achieve a relatively large capacitance value. An example of the material of which the dielectric layer 62d is made is an oxide or a nitride containing one or more selected from a group consisting of Zr, Al, La, Ba, Ta, Ti, Bi, Sr, Si, Y, and Hf. The material of which the dielectric layer 62d is made may be a secondary compound, a tertiary compound, or a quaternary compound. A material having a relatively high permittivity such as $HfO_2$, $Al_2O_3$, $ZrO_2$, $TiO_2$, or $SrTiO_3$ can be used as the material of which the dielectric layer 62d is made. The dielectric layer 62d may include two or more layers made of respective different materials.

The upper electrode 62u is stacked on the dielectric layer 62d. In this example, the upper electrode 62u covers a surface of the dielectric layer 62d that faces the second electrode 15c and side surfaces of the dielectric layer 62d. The upper electrode 62u is typically a metal electrode or a metal nitride electrode. That is, the capacitor 62 has a so-called MIM structure. A material similar to the material of which the lower electrode 62b is made can be used as a material of which the upper electrode 62u is made. The upper electrode 62u may be part of the wiring layer provided in the interlayer insulating layer 4d.

A protective layer made of a metal such as Cu or Al, polysilicon, or the like may be disposed between the upper electrode 62u and the dielectric layer 62d. By disposing the protective layer between the upper electrode 62u and the dielectric layer 62d, it is possible to suppress damage of the dielectric layer 62d in a production process, and it is therefore possible to suppress occurrence of a leak current between the upper electrode 62u and the lower electrode 62b.

The upper electrode 62u has an opening AP. A via vd, a connection part 66u, and a connection part 66b are disposed inside the opening AP. The connection part 66u and the connection part 66b are in the same layers as the upper electrode 62u and the lower electrode 62b, respectively. As illustrated in FIG. 20, the second electrode 15c of the photoelectric conversion unit 15 and a via vc having connection with the gate electrode 34e of the amplifier transistor 34 are connected to each other via the via vd, the connection part 66u, and the connection part 66b. The via vd can be made of a metal such as copper. The via vd, the connection part 66u, and the connection part 66b constitute part of an electric charge accumulation region in the unit pixel cell 60A.

In the configuration illustrated in FIG. 20, a part of the lower electrode 62b on the right side of the via vd is connected to the upper electrode 42e of the second capacitor 42 via the via vc1, a wiring layer 6b, a via vb1, a wiring layer 6a, a via va1, a wiring layer 6s, and a contact plug cpb provided in an interlayer insulating layer 4s. That is, the lower electrode 62b has connection with a reset drain node 46 that is not illustrated in FIG. 20. In this example, the lower electrode 62b is a single electrode provided for each unit pixel cell 60A (see FIG. 21 that will be described later), and two parts of the lower electrode 62b that are separated from each other on the left and right of the opening AP in FIG. 20 has equal voltages.

In this example, the upper electrode 62u covers a connection part 64b formed in the same layer as the lower electrode 62b. This connection part 64b is connected to a wire 6z, which is part of the wiring layer 6s, via a via vc3, the wiring layer 6b, a via vb3, the wiring layer 6a, and a via va3. The wire 6z has connection with a sensitivity adjustment wire 32 that is not illustrated in FIG. 20. That is, the capacitor 62 is electrically connected in parallel with the second capacitor 42 and functions in a similar manner to the second capacitor 42. That is, in this example, the unit pixel cell 60A has a capacitor circuit in which (i) a first capacitor 41 and (ii) the capacitor 62 and the second capacitor 42 are serially connected.

In a case where the capacitor 62 is formed in a unit pixel cell, the second capacitor 42 can be omitted. In a case where the second capacitor 42 is omitted, it is unnecessary to secure a region for the electrode region 42c in the semiconductor substrate 2. This improves flexibility of design of element layout in the semiconductor substrate 2. For example, a pixel size can be reduced by omission of the electrode region 42c. Alternatively, the size of a transistor (e.g., the amplifier transistor 34) on the semiconductor substrate 2 can be increased. A variation in characteristics of the transistors can be reduced due to the increase in the size of the transistor, and therefore a variation in sensitivity among unit pixel cells can be reduced. Furthermore, driving performance (i.e., transconductance $g_m$) is improved due to the increase in the size of the transistor, and therefore noise can be further reduced.

In this example, the upper electrode 62u is electrically connected to the via vc3 on a surface thereof opposite to a surface thereof that faces the second electrode 15c of the photoelectric conversion unit 15. By thus providing a contact for electrical connection between the upper electrode 62u and the sensitivity adjustment wire 32 on the surface closer to the semiconductor substrate 2, it is possible to avoid complicated wiring. Furthermore, since a distance between the upper electrode 62u and the second electrode 15c of the photoelectric conversion unit 15 can be reduced, and therefore parasitic capacitance of electric charge accumulation regions in adjacent pixels can be reduced.

During operation of the imaging device 101, a predetermined voltage is applied to the upper electrode 62u via the sensitivity adjustment wire 32. In this example, as with the lower electrode 62b, the upper electrode 62u is a single electrode provided for each unit pixel cell 60A (see FIG. 21 that will be described later), and two parts of the upper electrode 62u that are separated from each other on the left and right of the opening AP in FIG. 20 have equal voltages.

Figure 21:
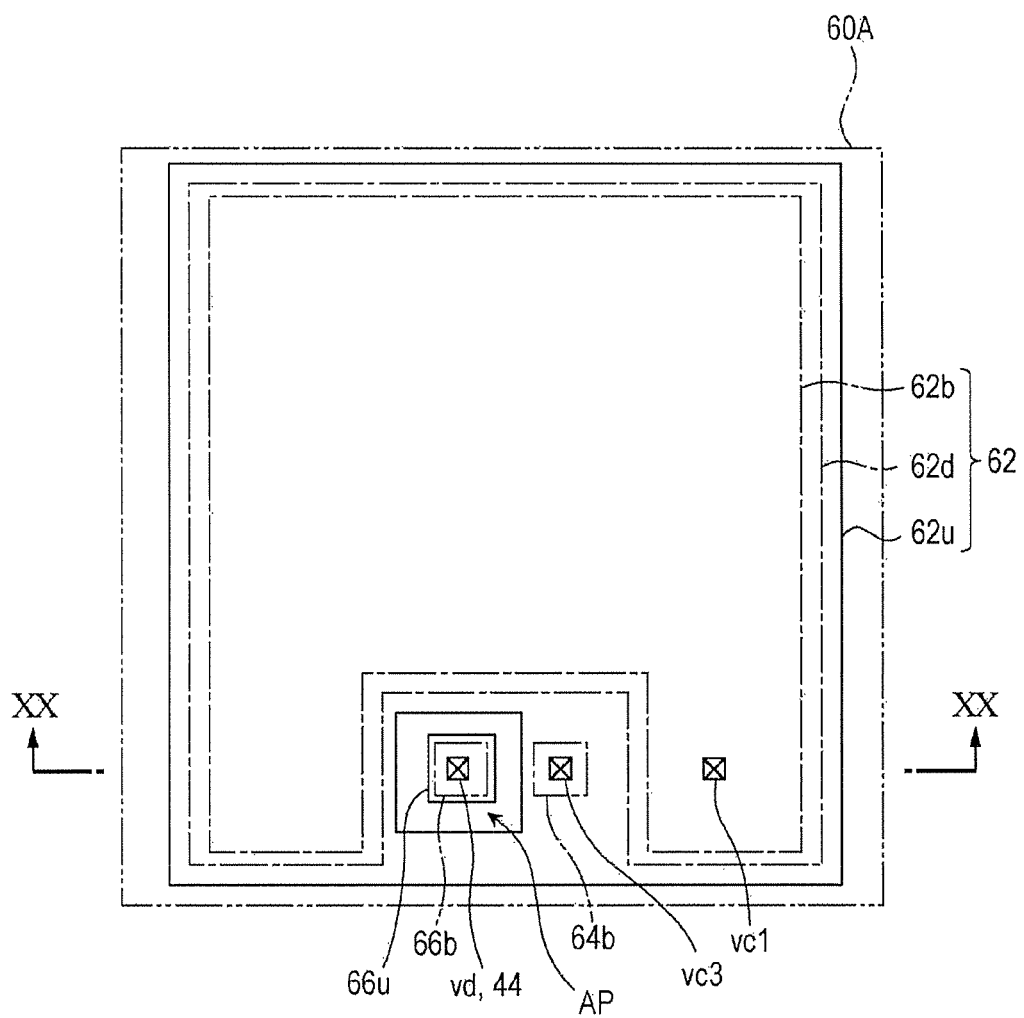
FIG. 21 is a schematic plan view illustrating an example of the way in which an upper electrode, a dielectric layer, and a lower electrode are disposed in a unit pixel cell illustrated in FIG. 20.

FIG. 21 illustrates an example of the way in which the upper electrode 62u, the dielectric layer 62d, and the lower electrode 62b are disposed when the unit pixel cell 60A is viewed from the normal to the semiconductor substrate 2. FIG. 21 illustrates a XX-XX section line similar to that of FIG. 5. As illustrated in FIG. 21, the shape of the upper electrode 62u need not be identical to that of the lower electrode 62b when viewed from the normal to the semiconductor substrate 2. It is only necessary that the upper electrode 62u include part that faces at least part of the lower electrode 62b when viewed from the normal to the semiconductor substrate 2.

In this example, the lower electrode 62b and the upper electrode 62u occupy a large region in the unit pixel cell 60A. Therefore, by forming at least one of the lower electrode 62b and the upper electrode 62u as a light-shielding electrode, the at least one of the lower electrode 62b and the upper electrode 62u can function as a light-shielding layer. By causing, for example, the upper electrode 62u to function as a light-shielding layer, light that has passed a gap between the second electrodes 15c can be shielded by the upper electrode 62u. This makes it possible to prevent light that has passed the gap between the second electrodes 15c from entering channel regions of the transistors (e.g., the amplifier transistor 34) on the semiconductor substrate 2. For example, a sufficient light-shielding effect can be achieved by forming a TaN electrode having a thickness of 100 nm as the upper electrode 62u.

According to the Fourth Embodiment, it is possible to suppress incident stray light on the channel regions of the transistors on the semiconductor substrate 2, thereby suppressing a shift of characteristics of the transistors (e.g., a fluctuation of a threshold voltage). By suppressing incident stray light on the channel regions of the transistors on the semiconductor substrate 2, the characteristics of the transistors of each pixel are stabilized, and a variation of operation of the transistors among a plurality of pixels can be reduced. Suppressing incident stray light on the channel regions of the transistors on the semiconductor substrate 2 contributes to an improvement in reliability of the imaging device.

In the configuration illustrated in FIG. 21, the upper electrodes 62u are spatially separated, and therefore the upper electrodes 62u are electrically separated among the unit pixel cells 60A. That is, in this example, a slight gap exists between adjacent upper electrodes 62u. However, each of the upper electrodes 62u is configured so that a predetermined voltage is supplied thereto via the sensitivity adjustment wire 32. Therefore, a distance between adjacent upper electrodes 62u can be made sufficiently smaller than a distance between adjacent second electrodes 15c. This allows the upper electrodes 62u to shield a large part of the light that has passed the gap between the second electrodes 15c. In the circuit configuration illustrated in FIG. 1, a common voltage is applied to the upper electrodes 62u in unit pixel cells belonging to an identical row. Therefore, a plurality of band-like electrodes that extend in a row direction over a plurality of columns may be used as the upper electrode 62u. Needless to say, it is also possible that the upper electrodes 62u in the unit pixel cells 60A be spatially separated from each other as illustrated in FIG. 21 and an independent voltage be supplied to each upper electrode 62u.

In this example, the opening AP of the upper electrode 62u is formed in a lower part of the unit pixel cell 60A in FIG. 21. However, the position of the opening AP is not limited to this example. For example, it is also possible that the opening AP be located at the center of the unit pixel cell 60A and the upper electrode 62u be formed so as to surround the connection part 66u and the connection part 66b. A configuration in which the opening AP is located at the center of the unit pixel cell 60A and the shape of the upper electrode 62u is symmetrical with respect to the connection part 66u can reduce unbalance of capacitance in the unit pixel cell 60A and is therefore advantageous. The shape of the upper electrode 62u viewed from the normal to the semiconductor substrate 2 is not limited to the shape illustrated in FIG. 21. For example, the upper electrode 62u may include a plurality of parts. The same applies to the dielectric layer 62d and the lower electrode 62b.

As described above, in this example, the upper electrode 62u has connection with the sensitivity adjustment wire 32, and therefore the voltage of the upper electrode 62u during operation of the imaging device 101 can be made constant by supplying a constant voltage to the upper electrode 62u via the sensitivity adjustment wire 32. Therefore, by forming the upper electrode 62u so as to surround the connection part 66u and the connection part 66b and by applying a constant voltage to the upper electrode 62u, the upper electrode 62u can be caused to function as a shield electrode. In a case where the upper electrode 62u functions as a shield electrode, it is possible to suppress noise contamination in the electric charge accumulation node 44.

As described above, in the Fourth Embodiment, the capacitor 62 is disposed between the upper electrode 41w and the second electrode 15c of the photoelectric conversion unit 15 as a capacitor connected between the reset drain node 46 and the sensitivity adjustment wire 32. As illustrated in FIG. 20, the capacitor 62 is disposed in an interlayer insulating layer (e.g., the interlayer insulating layer 4d) in each unit pixel cell. It is therefore possible to form the capacitor 62 having a so-called MIM structure. That is, a relatively large capacitance value is easily obtained in the capacitor 62. Such a configuration also makes it possible to reduce kTC noise that occurs due to reset while suppressing an increase in capacitance value of the entire electric charge accumulation region as in the First through Third Embodiments. Furthermore, in a case where the capacitor 62 has a high capacitance value, the capacitance value of the entire electric charge accumulation region can be made higher. This is advantageous for imaging under high illuminance.

Method for Forming Capacitor 62

An outline of a method for producing an imaging device having the unit pixel cell 60A is described below. Production steps before formation of the via vc can be similar to those in the First Embodiment, and therefore description thereof is omitted. As described with reference to FIG. 12, the upper electrode 43e electrically connected to the electrode region 42c may be formed so as to overlap the upper electrode 42e of the second capacitor 42. In this example, the vias vc1 and vc3 are also formed in parallel with formation of the via vc.

After formation of the vias vc, vc1, and vc3, the lower electrode 62b, the connection part 66b, and the connection part 64b are formed on the interlayer insulating layer 4c. In this example, TaN is used as a material of which the lower electrode 62b, the connection part 66b, and the connection part 64b are made. Photolithography, which is introduced in a general semiconductor process, is applicable to formation of the lower electrode 62b, the connection part 66b, and the connection part 64b on the interlayer insulating layer 4c. Then, a dielectric film is formed by depositing the material of the dielectric layer 62d, and the dielectric film is patterned.

For example, Atomic Layer Deposition (ALD) is applicable to formation of the dielectric film. ALD allows different types of atoms (several atoms for each type) to be stacked. In this example, a film of an Hf oxide is formed as the dielectric film. In formation of the film of the Hf oxide, tetrakis ethylmethylamido hafnium is used as a precursor, and plasma discharge is performed after introduction of the precursor. Oxidation of Hf is promoted by performing plasma discharge in an oxygen atmosphere. By repeating the above steps, layers of $HfO_2$ are stacked one by one. For example, a film having a thickness of 22 nm is formed by repeating introduction of a gaseous precursor and plasma discharge 250 times.

Photolithography, which is introduced in a general semiconductor process, is applicable to patterning of the dielectric film. The dielectric layer 62d is formed by patterning of the dielectric film. The dielectric layer 62d may be a continuous single film or may include a plurality of parts disposed on respective different parts of the lower electrode 62b.

The upper electrode 62u and the connection part 66u are formed in a manner similar to the lower electrode 62b after formation of the dielectric layer 62d. Then, the interlayer insulating layer 4d and the via vd are formed, and the photoelectric conversion unit 15 is formed on the interlayer insulating layer 4d. In this way, the device structure illustrated in FIG. 20 is obtained.

The second electrode 15c of the photoelectric conversion unit 15 may be formed by using a metal nitride such as TiN, TaN, or WN. The metal nitride is excellent in denseness and has a property such that movement and/or contamination with an impurity element are hard to occur even under high temperature. Therefore, by forming the upper electrode 62u located above the dielectric layer 62d by using a metal nitride (TaN in this example) and by forming the second electrode 15c by using a metal nitride, it is possible to suppress contamination of the dielectric layer 62d with a carrier caused by impurities. By suppressing contamination of the dielectric layer 62d with impurities, it is possible to reduce a leak current between the upper electrode 62u and the lower electrode 62b in the capacitor 62.

Furthermore, since migration is hard to occur during sputtering of a metal nitride, it is easy to form a flat surface. In a case where the second electrode 15c of the photoelectric conversion unit 15 is formed by using a metal nitride, joining of a flat interface can be achieved. By suppressing concavities and convexities on the surface of the second electrode 15c, smooth electric charge transport between the second electrode 15c and the photoelectric conversion film 15b can be achieved. Furthermore, it is possible to suppress occurrence of an interface state caused by an interface defect, thereby suppressing a dark current. Formation of both of the upper electrode 62u of the capacitor 62 and the second electrode 15c of the photoelectric conversion unit 15 by using a metal nitride is useful from the perspective of a reduction of a leak current and a dark current. Furthermore, formation of the lower electrode 62b of the capacitor 62 by using a metal nitride can further improve flatness of the upper electrode 62u and is therefore useful. Moreover, this is useful since oxidation of the dielectric layer 62d can be suppressed.

First Modification of Fourth Embodiment

Figure 22:
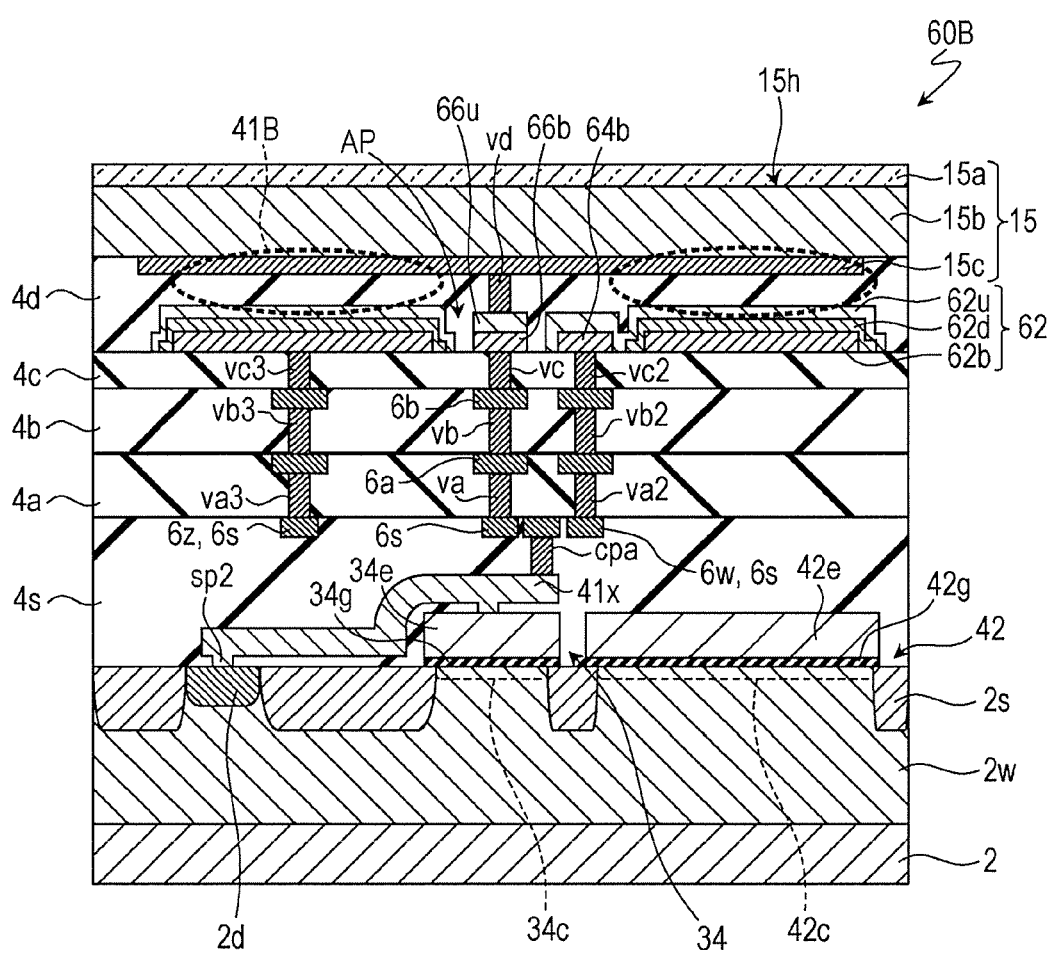
FIG. 22 is a schematic cross-sectional view illustrating a still another example of a device structure of a unit pixel cell in the imaging device according to the Fourth Embodiment.
Figure 23:
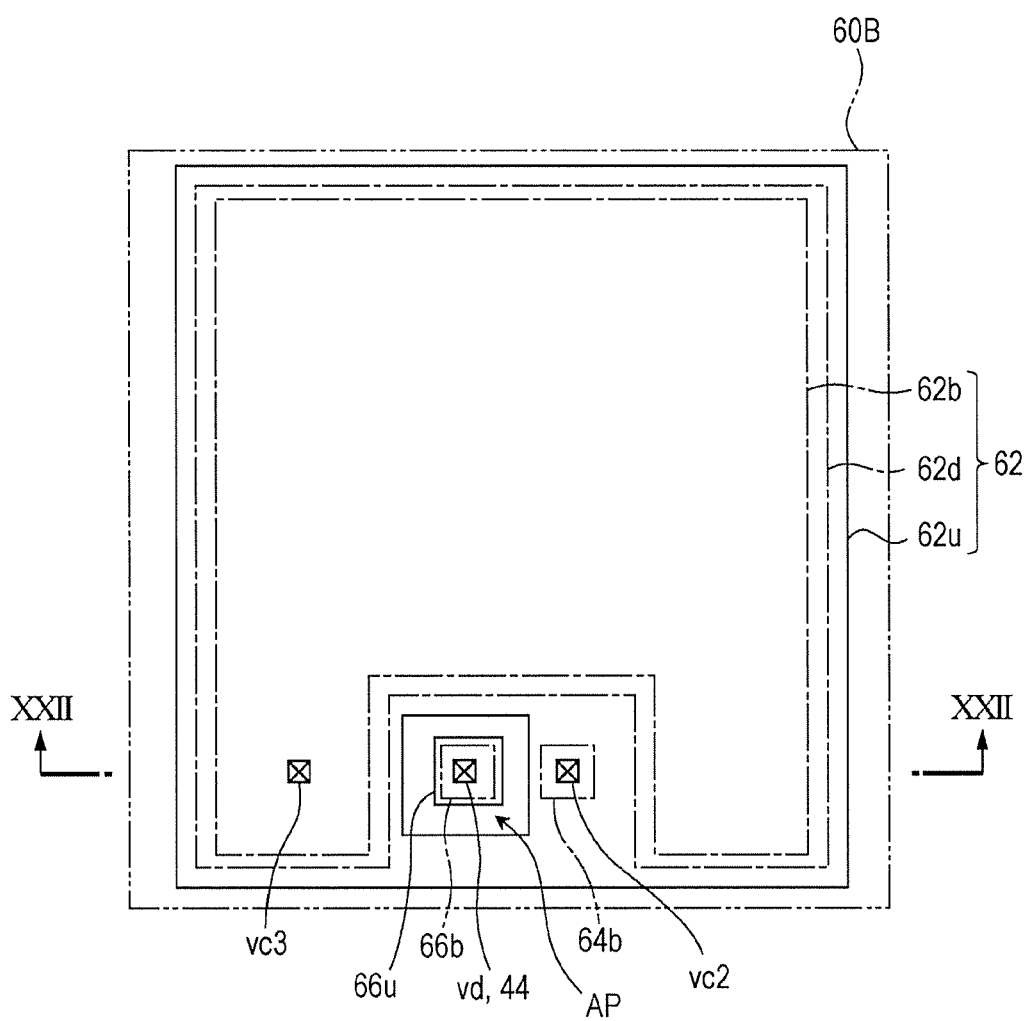
FIG. 23 is a schematic plan view illustrating an example of the way in which an upper electrode, a dielectric layer, and a lower electrode are disposed in a unit pixel cell illustrated in FIG. 22.

FIG. 22 schematically illustrates still another example of a device structure of a unit pixel cell. FIG. 23 illustrates an example of the way in which an upper electrode 62u, a dielectric layer 62d, and a lower electrode 62b are disposed when a unit pixel cell 60B illustrated in FIG. 22 is viewed from the normal to a semiconductor substrate 2. FIG. 22 is a diagram corresponding to a cross-sectional view taken along the line XXII-XXII of FIG. 23. A main difference between the unit pixel cell 60B illustrated in FIGS. 22 and 23 and the unit pixel cell 60A described with reference to FIGS. 20 and 21 is that the upper electrode 62u and the lower electrode 62b are connected to a reset drain node 46 and a sensitivity adjustment wire 32, respectively.

As illustrated in FIG. 22, in this example, the upper electrode 62u is connected to a wire 6w which is part of a wiring layer 6s via a connection part 64b, a via vc2, a wiring layer 6b, a via vb2, a wiring layer 6a, and a via va2. This wire 6w has connection with the reset drain node 46. That is, the upper electrode 62u has connection with the reset drain node 46. Meanwhile, the lower electrode 62b is connected to a wire 6z via a via vc3, the wiring layer 6b, a via vb3, the wiring layer 6a, and a via va3. As described above, this wire 6z has connection with the sensitivity adjustment wire 32 (not illustrated in FIG. 22). That is, the lower electrode 62b has connection with the sensitivity adjustment wire 32. That is, also in this example, a capacitor 62 is connected between the reset drain node 46 and the sensitivity adjustment wire 32. Accordingly, the capacitor 62 functions as the second capacitor 42 described above. Furthermore, in this example, since the lower electrode 62b has connection with the sensitivity adjustment wire 32, the voltage of the lower electrode 62b can be controlled via the sensitivity adjustment wire 32. By controlling the voltage of the lower electrode 62b, it is possible to control the voltage of the electric charge accumulation node 44, thereby adjusting sensitivity of the imaging device. Furthermore, in a case where a constant voltage is supplied to the lower electrode 62b via the sensitivity adjustment wire 32 during operation of the imaging device, the lower electrode 62b can be caused to function as a shield electrode.

As illustrated in FIG. 22, in this example, an upper electrode 41x that connects a source or a drain (a source/drain diffusion layer 2d) of a first reset transistor 36 and a gate electrode 34e of an amplifier transistor 34 does not extend to a region above an upper electrode 42e. In other words, the upper electrode 41x does not overlap the upper electrode 42e when viewed from the normal to the semiconductor substrate 2. Accordingly, the unit pixel cell 60B does not include, in the interlayer insulating layer 4s, a first capacitor 41 made up of two polysilicon layers that face each other and an insulating film sandwiched between the two polysilicon layers.

Turning attention to a photoelectric conversion unit 15 and the capacitor 62, the second electrode 15c of the photoelectric conversion unit 15 and the upper electrode 62u of the capacitor 62 face each other via an interlayer insulating layer 4d. As described above, in this example, the upper electrode 62u has connection with the reset drain node 46. That is, a capacitor 41B formed by the second electrode 15c, the upper electrode 62u, and the interlayer insulating layer 4d can be regarded as a capacitor connected between the electric charge accumulation node 44 and the reset drain node 46. For example, as is clear from the circuit configuration illustrated in FIG. 2, this capacitor 41B functions in a similar manner to the first capacitor 41 described above. That is, in this example, (i) the capacitor 41B and (ii) the capacitor 62 and the second capacitor 42 are serially connected to each other so as to form a capacitor circuit.

As described above, a capacitor formed between the second electrode 15c of the photoelectric conversion unit 15 and the upper electrode 62u of the capacitor 62 may be used as a low-capacitance capacitor instead of the first capacitor 41. Also according to such a configuration, the second capacitor 42 that is a so-called MIS capacitor can be omitted as long as a sufficiently large capacitance value is obtained by the capacitor 62.

Note that the upper electrode 41x may be extended to a region above the upper electrode 42e of the second capacitor 42, for example, like the upper electrode 41w illustrated in FIG. 20. However, a configuration in which the upper electrode 41x does not overlap the upper electrode 42e of the second capacitor 42 is more advantageous from the perspective of reduction of noise and suppression of a decrease in conversion gain.

A method for producing the unit pixel cell 60B can be almost similar to the method for producing the unit pixel cell 60A except for that a pattern of a resist mask for forming the upper electrode 41x and a pattern of a resist mask for forming the wiring layer 6s are different. Therefore, description of the method for producing the unit pixel cell 60B is omitted.

Second Modification of Fourth Embodiment

Figure 24:
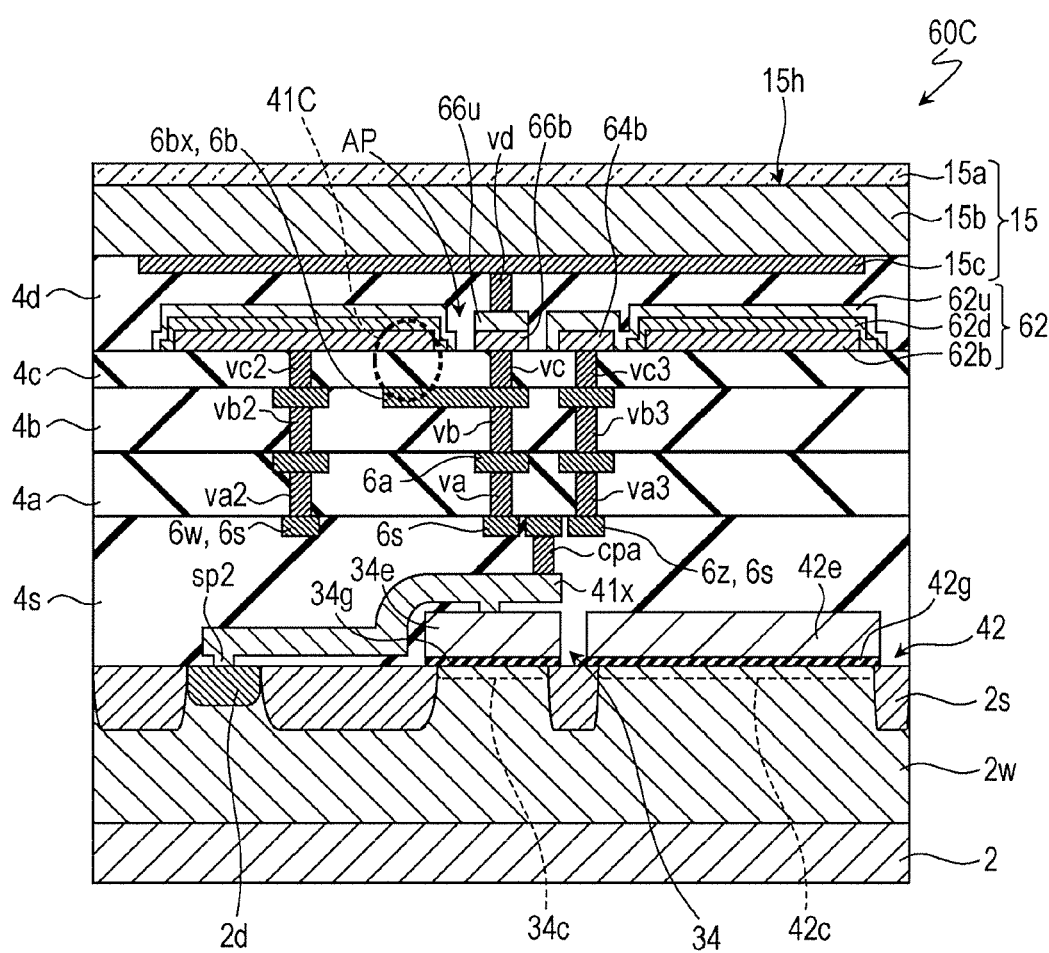
FIG. 24 is a schematic cross-sectional view illustrating a still another example of a device structure of a unit pixel cell in the imaging device according to the Fourth Embodiment.
Figure 25:
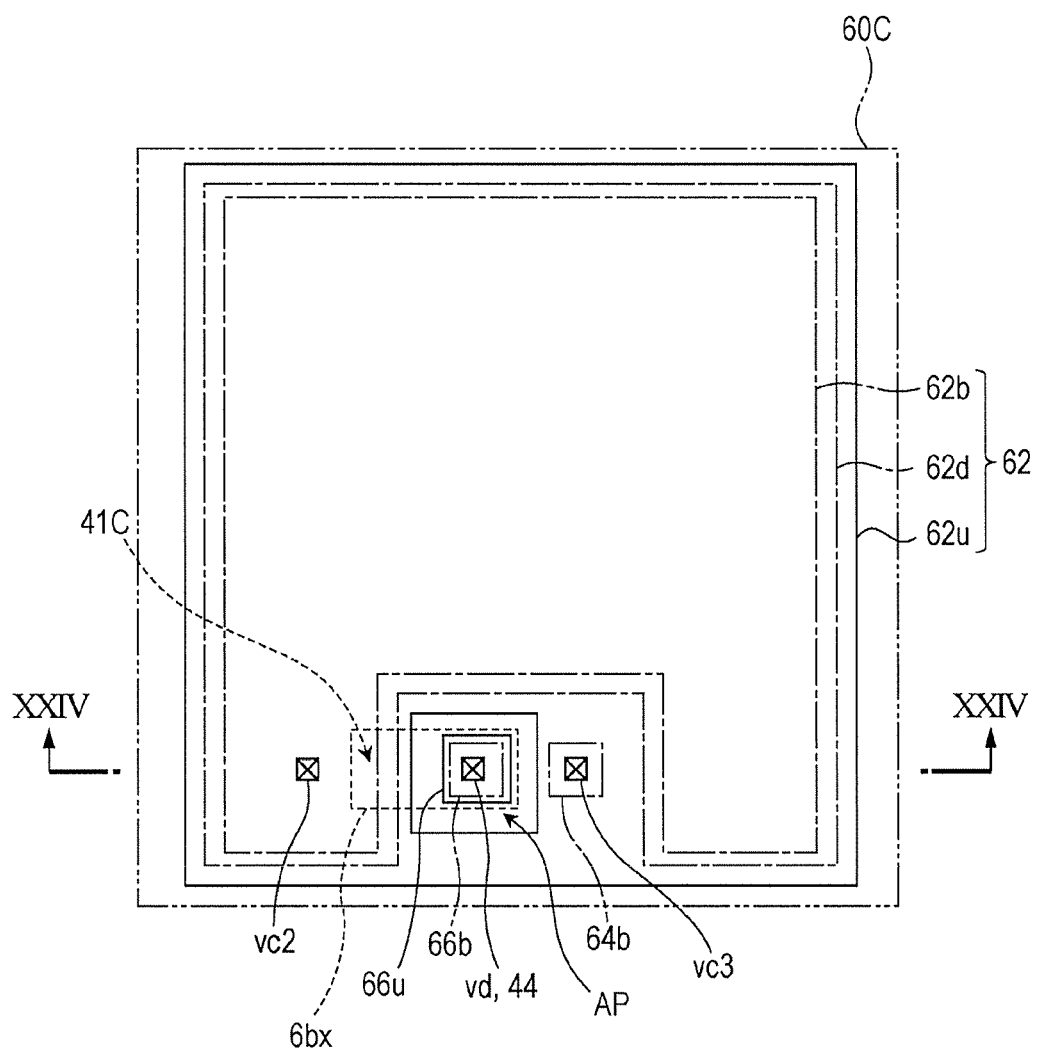
FIG. 25 is a schematic plan view illustrating an example of the way in which an upper electrode, a dielectric layer, and a lower electrode are disposed in a unit pixel cell illustrated in FIG. 24.

FIG. 24 schematically illustrates a still another example of a device structure of a unit pixel cell. FIG. 25 illustrates an example of the way in which an upper electrode 62u, a dielectric layer 62d, and a lower electrode 62b are disposed in a case where a unit pixel cell 60C illustrated in FIG. 24 is viewed from the normal to the semiconductor substrate 2. FIG. 24 is a diagram corresponding to a cross-sectional view taken along the line XXIV-XXIV of FIG. 25. A main difference between the unit pixel cell 60C illustrated in FIGS. 24 and 25 and the unit pixel cell 60A described with reference to FIGS. 20 and 21 is that a low-capacitance capacitor 41C having a lower electrode 62b as one of electrodes thereof is formed in an interlayer insulating layer instead of the first capacitor 41.

In the unit pixel cell 60C illustrated in FIG. 24, a lower electrode 62b and an upper electrode 62u are connected to a reset drain node 46 and a sensitivity adjustment wire 32, respectively, as in the unit pixel cell 60A described with reference to FIG. 20. The unit pixel cell 60C does not have a first capacitor 41 in an interlayer insulating layer 4s, as in the unit pixel cell 60B described with reference to FIG. 22.

In the configuration illustrated in FIG. 24, a wiring layer 6b formed in an interlayer insulating layer 4b includes an electrode 6bx disposed between a via vc and a via vb. As schematically illustrated in FIGS. 24 and 25, the electrode 6bx has a part that overlaps the lower electrode 62b when viewed from the normal to the semiconductor substrate 2. That is, at least part of the electrode 6bx faces at least part of the lower electrode 62b via at least part of an interlayer insulating layer 4c. This forms the capacitor 41C between the capacitor 62 and a wiring layer (the electrode 6bx in this example) disposed in an interlayer insulating layer (the interlayer insulating layer 4c in this example). Of the interlayer insulating layer 4c, a part sandwiched between the lower electrode 62b and the electrode 6bx functions as a dielectric layer of the capacitor 41C. Since the lower electrode 62b has connection with the reset drain node 46 and the electrode 6bx has connection with the second electrode 15c, the capacitor 41C functions in a manner similar to the first capacitor 41 described above. That is, in this example, (i) the capacitor 41C and (ii) the capacitor 62 and the second capacitor 42 are serially connected to form a capacitor circuit.

As described above, a capacitor may be formed between the capacitor 62 and the wiring layer disposed in the interlayer insulating layer. According to such a configuration, a low-capacitance (e.g., approximately 0.5 fF) capacitor can be relatively easily disposed in a unit pixel cell. In this example, part (the electrode 6bx in this example) of the wiring layer 6b is used as one of electrodes of the low-capacitance capacitor, but the one of the electrodes of the low-capacitance capacitor may be part of another wiring layer such as a wiring layer 6a or 6s. Also in the configuration described with reference to FIGS. 24 and 25, a second capacitor 42 that is a so-called MIS capacitor can be omitted as long as a sufficiently large capacitance value is obtained by the capacitor 62.

A method for producing the unit pixel cell 60C can be almost similar to the method for producing the unit pixel cell 60A except for that a pattern of a resist mask for forming the upper electrode 41x and a pattern of a resist mask for forming the electrode 6bx are different. Therefore, description of the method for producing the unit pixel cell 60C is omitted.

Fifth Embodiment

A camera system 105 according to the present embodiment is described below with reference to FIG. 26.

Figure 26:
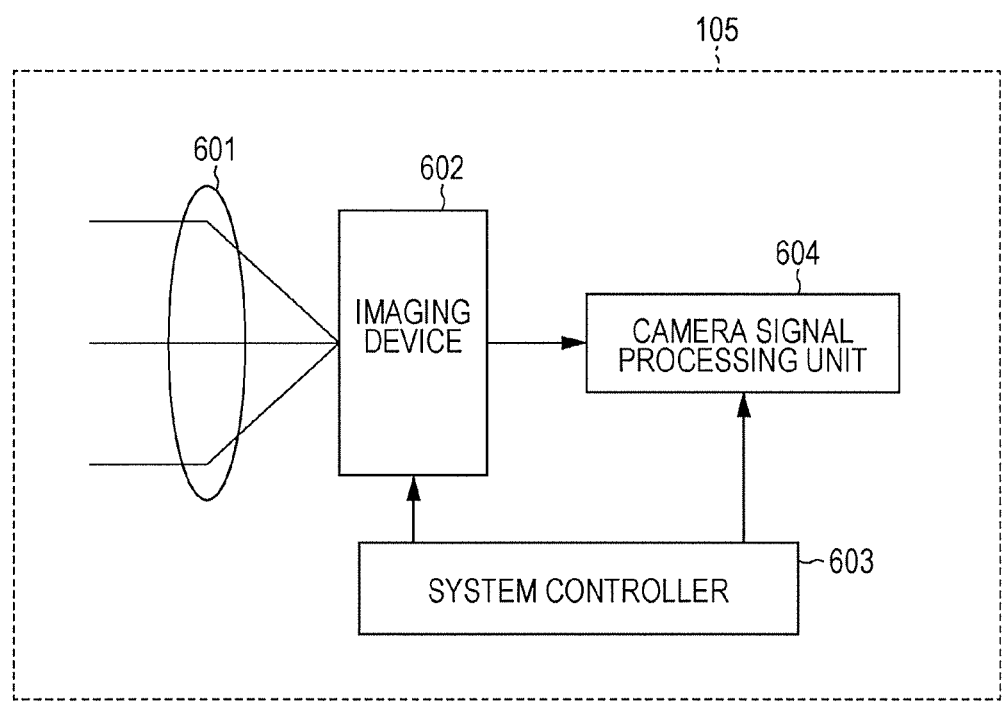
FIG. 26 is a schematic view illustrating an example of a configuration of a camera system according to the Fifth Embodiment.

FIG. 26 schematically illustrates an example of a configuration of the camera system 105 according to the present embodiment. The camera system 105 includes a lens optical system 601, an imaging device 602, a system controller 603, and a camera signal processing unit 604.

The lens optical system 601 includes, for example, a lens for automatic focus, a lens for zooming, and a diaphragm. The lens optical system 601 collects light onto an imaging surface of the imaging device 602. An imaging device according to any one of the First through Fourth Embodiments described above can be widely used as the imaging device 602.

The system controller 603 controls the entire camera system 105. The system controller 603 is, for example, realized by a microcomputer.

The camera signal processing unit 604 functions as a signal processing circuit that processes an output signal from the imaging device 602. The camera signal processing unit 604 performs processing such as gamma correction, color interpolation processing, space interpolation processing, and auto white balance. The camera signal processing unit 604 can be, for example, realized by a DSP (Digital Signal Processor).

According to the camera system according to the present embodiment, reset noise (kTC noise) at the time of readout can be properly suppressed by using an imaging device according to any one of the First through Fourth Embodiments. As a result, an electric charge can be accurately read out, and a good image can be acquired.

As described in detail in the First Embodiment, a camera system that can take a photograph while switching between a mode in which a bright subject can be imaged with low sensitivity and a mode in which a dark subject can be imaged with relatively high sensitivity can be provided.

According to the embodiments of the present disclosure, kTC noise can be reduced. Furthermore, the present disclosure is useful for a digital camera and the like since a dynamic range can be increased by a simple configuration.

What is claimed is:

1. An imaging device comprising:
   a semiconductor substrate;
   a photoelectric converter stacked on the semiconductor substrate, the photoelectric converter being configured to generate a signal through photoelectric conversion of incident light;
   a multilayer wiring structure located between the semiconductor substrate and the photoelectric converter; and
   circuitry located in the multilayer wiring structure and the semiconductor substrate, the circuitry being configured to detect the signal, wherein
   the circuitry includes:
      a first capacitance element and a second capacitance element; and
      a first transistor including a first source and a first drain in the semiconductor substrate and a first gate,
   the first capacitance element includes a first electrode, a second electrode, and a dielectric film sandwiched between the first electrode and the second electrode,
   the multilayer wiring structure includes an insulating layer adjacent to the first capacitance element, and
   a permittivity of the dielectric film is greater than a permittivity of the insulating layer.

2. The imaging device according to claim 1, wherein at least one of the first capacitance element and the second capacitance element is electrically connected to the first gate without switching element intervention.

3. The imaging device according to claim 1, wherein at least one of the first capacitance element and the second capacitance element is electrically connected to the first gate in a period in which the first transistor outputs a signal.

4. The imaging device according to claim 1, wherein
   the circuitry includes a second transistor including a second source and a second drain, one of the second source and the second drain being electrically connected to the first electrode of the first capacitance element, and
   a conversion gain is switched by turning the second transistor on and off.

5. The imaging device according to claim 1, wherein the circuitry includes:
   a charge accumulation node electrically connected to the first gate; and
   a second transistor including a second source and a second drain, one of the second source and the second drain is electrically connected to the charge accumulation node.

6. The imaging device according to claim 1, wherein
   the second capacitance element includes a third electrode and a fourth electrode, and
   one of the third electrode and the fourth electrode is electrically connected to one of the first electrode and the second electrode.

7. An imaging device comprising:
   a semiconductor substrate;
   a photoelectric converter stacked on the semiconductor substrate, the photoelectric converter being configured to generate a signal through photoelectric conversion of incident light;
   a multilayer wiring structure located between the semiconductor substrate and the photoelectric converter; and
   circuitry located in the multilayer wiring structure and the semiconductor substrate, the circuitry being configured to detect the signal, wherein
   the circuitry includes:
      a first capacitance element; and
      a first transistor including a first source and a first drain in the semiconductor substrate and a first gate,
   the first capacitance element includes a first electrode, a second electrode, and a dielectric film sandwiched between the first electrode and the second electrode,
   the multilayer wiring structure includes an insulating layer adjacent to the first capacitance element,
   a permittivity of the dielectric film is greater than a permittivity of the insulating layer, and
   the first capacitance element has an electrical coupling to the first gate not through a switching element.

8. An imaging device comprising:
   a semiconductor substrate;
   a photoelectric converter stacked on the semiconductor substrate, the photoelectric converter being configured to generate a signal through photoelectric conversion of incident light;
   a multilayer wiring structure located between the semiconductor substrate and the photoelectric converter; and
   circuitry located in the multilayer wiring structure and the semiconductor substrate, the circuitry being configured to detect the signal, wherein
   the circuitry includes:
      a first capacitance element; and
      a first transistor including a first source and a first drain in the semiconductor substrate and a first gate,
   the first capacitance element includes a first electrode, a second electrode, and a dielectric film sandwiched between the first electrode and the second electrode,
   the multilayer wiring structure includes an insulating layer adjacent to the first capacitance element,
   a permittivity of the dielectric film is greater than a permittivity of the insulating layer, and
   the first capacitance element has an electrical coupling to the first gate in a period in which the first transistor outputs a signal.

* * * * *